(12) United States Patent
Kagan

(10) Patent No.: US 11,686,749 B2
(45) Date of Patent: Jun. 27, 2023

(54) POWER METER HAVING MULTIPLE ETHERNET PORTS

(71) Applicant: Electro Industries/Gauge Tech, Westbury, NY (US)

(72) Inventor: Erran Kagan, Great Neck, NY (US)

(73) Assignee: EI ELECTRONICS LLC, Westbury, NY (US)

( * ) Notice: Subject to any disclaimer, the term of this patent is extended or adjusted under 35 U.S.C. 154(b) by 0 days.

(21) Appl. No.: 14/946,091

(22) Filed: Nov. 19, 2015

(65) Prior Publication Data

US 2016/0069941 A1 Mar. 10, 2016

Related U.S. Application Data

(63) Continuation of application No. 13/463,192, filed on May 3, 2012, now Pat. No. 9,194,720, which is a
(Continued)

(51) Int. Cl.
*G01R 21/133* (2006.01)
*G01D 4/00* (2006.01)

(52) U.S. Cl.
CPC .......... *G01R 21/133* (2013.01); *G01D 4/002* (2013.01); *G01D 4/004* (2013.01); *Y02B 70/30* (2013.01);
(Continued)

(58) Field of Classification Search
CPC ...... G01D 4/002; G01D 4/004; G01R 21/133; Y02B 70/3266; Y02B 90/241;
(Continued)

(56) References Cited

U.S. PATENT DOCUMENTS 1,863,741 A 6/1932 Leon
2,292,163 A 8/1942 Shea
(Continued)

FOREIGN PATENT DOCUMENTS

JP 08247783 9/1996
WO 9854583 A1 12/1998
(Continued)

OTHER PUBLICATIONS

"muNet Demonstrates End-toEnd IP-Based Energy Management System at DistribuTECH," pp. 1-2 at http://www.munet.com/muNetNewPressReleases.sub.-0205001.htm, May 24, 2001.
(Continued)

*Primary Examiner* — Alina A Boutah
(74) *Attorney, Agent, or Firm* — Robinson + Cole LLP

(57) ABSTRACT

A power meter or other electrical device is provided having two independent and communicatively isolated Ethernet ports. The first Ethernet port is addressable by a first unique identifier and is configured for enabling full access to the power meter via an internal LAN. This enables a LAN operator to remotely access the power meter via the internal LAN for performing metering functions, such as full telemetry, control and programming. The second Ethernet port is addressable by a second unique identifier and is configured for being connected to the Internet. Since the second Ethernet port is communicatively isolated from the first Ethernet port, a user can access the power meter via the Internet, but cannot access the internal LAN by connecting to the power meter via the Internet.

32 Claims, 9 Drawing Sheets

Related U.S. Application Data continuation of application No. 12/824,459, filed on Jun. 28, 2010, now Pat. No. 8,176,174, which is a continuation of application No. 11/039,316, filed on Jan. 19, 2005, now Pat. No. 7,747,733.

(60) Provisional application No. 60/621,750, filed on Oct. 25, 2004.

(52) U.S. Cl.
CPC .............. *Y02B 90/20* (2013.01); *Y04S 20/242* (2013.01); *Y04S 20/30* (2013.01)

(58) Field of Classification Search
CPC ..... Y02B 90/246; Y04S 20/242; Y04S 20/32; Y04S 20/42; Y04S 20/46
See application file for complete search history.

(56) References Cited

U.S. PATENT DOCUMENTS

| | | |
|---|---|---|
| 2,435,753 A | 2/1948 | Walther et al. |
| 2,606,943 A | 8/1952 | Barker |
| 2,883,255 A | 4/1959 | Anderson |
| 2,900,605 A | 8/1959 | Squires et al. |
| 2,987,704 A | 6/1961 | Gimpel et al. |
| 2,992,365 A | 7/1961 | Brill |
| 3,084,863 A | 4/1963 | Du |
| 3,142,820 A | 7/1964 | Daniels |
| 3,166,726 A | 1/1965 | Jensen et al. |
| 3,205,439 A | 9/1965 | Michael et al. |
| 3,333,194 A | 7/1967 | Reynolds |
| 3,453,540 A | 7/1969 | Dusheck, Jr. |
| 3,458,810 A | 7/1969 | Wald |
| 3,467,864 A | 9/1969 | Plaats |
| 3,504,164 A | 3/1970 | Farrell et al. |
| 3,534,247 A | 10/1970 | Miljanic |
| 3,535,637 A | 10/1970 | Goransson |
| 3,629,852 A | 12/1971 | Thexton et al. |
| 3,737,891 A | 6/1973 | Metcalf |
| 3,815,013 A | 6/1974 | Milkovic |
| 3,824,441 A | 7/1974 | Heyman et al. |
| 3,995,210 A | 11/1976 | Milkovic |
| 4,066,960 A | 1/1978 | Milkovic |
| 4,077,061 A | 2/1978 | Johnston et al. |
| 4,140,952 A | 2/1979 | Miller |
| 4,158,810 A | 6/1979 | Leskovar |
| 4,182,983 A | 1/1980 | Heinrich et al. |
| 4,215,697 A | 8/1980 | Demetrescu |
| 4,240,149 A | 12/1980 | Fletcher et al. |
| 4,246,623 A | 1/1981 | Sun |
| 4,255,707 A | 3/1981 | Miller |
| 4,283,772 A | 8/1981 | Johnston |
| 4,336,736 A | 6/1982 | Mishima |
| 4,345,311 A | 8/1982 | Fielden |
| 4,360,879 A | 11/1982 | Cameron |
| 4,415,896 A | 11/1983 | Allgood |
| 4,437,059 A | 3/1984 | Hauptmann |
| 4,442,492 A | 4/1984 | Karlsson et al. |
| 4,463,311 A | 7/1984 | Kobayashi |
| 4,466,071 A | 8/1984 | Russell |
| 4,486,707 A | 12/1984 | Randall et al. |
| 4,495,463 A | 1/1985 | Milkovic |
| 4,608,533 A | 8/1986 | Starkie |
| 4,623,997 A | 11/1986 | Tulpule |
| 4,642,563 A | 2/1987 | McEachern et al. |
| 4,689,752 A | 8/1987 | Fernandes et al. |
| 4,709,339 A | 11/1987 | Fernandes |
| 4,713,608 A | 12/1987 | Catiller et al. |
| 4,713,609 A | 12/1987 | Losapio et al. |
| 4,742,296 A | 5/1988 | Petr et al. |
| 4,799,008 A | 1/1989 | Kannari |
| 4,804,957 A | 2/1989 | Selph et al. |
| 4,839,819 A | 6/1989 | Begin et al. |
| 4,841,236 A | 6/1989 | Miljanic et al. |
| 4,843,311 A | 6/1989 | Rozman et al. |
| 4,884,021 A | 11/1989 | Hammond et al. |
| 4,897,599 A | 1/1990 | Koslar |
| 4,902,965 A | 2/1990 | Bodrug et al. |
| 4,933,633 A | 6/1990 | Allgood |
| 4,949,029 A | 8/1990 | Cooper et al. |
| 4,958,294 A | 9/1990 | Herscher et al. |
| 4,958,640 A | 9/1990 | Logan |
| 4,979,122 A | 12/1990 | Davis et al. |
| 4,989,155 A | 1/1991 | Begin et al. |
| 4,996,646 A | 2/1991 | Farrington |
| 4,999,572 A | 3/1991 | Bickford et al. |
| 5,006,790 A | 4/1991 | Beverly et al. |
| 5,006,846 A | 4/1991 | Granville et al. |
| 5,014,229 A | 5/1991 | Mofachern |
| 5,017,860 A | 5/1991 | Germer et al. |
| 5,079,715 A | 1/1992 | Venkataraman et al. |
| 5,081,701 A | 1/1992 | Silver |
| 5,122,735 A | 6/1992 | Porter et al. |
| 5,132,609 A | 7/1992 | Nguyen |
| 5,132,610 A | 7/1992 | Ying-Chang |
| 5,166,887 A | 11/1992 | Farrington et al. |
| 5,170,115 A | 12/1992 | Kashiwabara et al. |
| 5,170,360 A | 12/1992 | Porter et al. |
| 5,185,705 A | 2/1993 | Farrington |
| 5,212,441 A | 5/1993 | McEachern et al. |
| 5,220,495 A | 6/1993 | Zulaski |
| 5,224,054 A | 6/1993 | Wallis |
| 5,226,120 A | 7/1993 | Brown et al. |
| 5,229,713 A | 7/1993 | Bullock et al. |
| 5,233,538 A | 8/1993 | Wallis |
| 5,237,511 A | 8/1993 | Caird et al. |
| 5,243,536 A | 9/1993 | Bradford |
| 5,245,275 A | 9/1993 | Germer et al. |
| 5,248,935 A | 9/1993 | Sakoyama et al. |
| 5,248,967 A | 9/1993 | Daneshfar |
| 5,258,704 A | 11/1993 | Germer et al. |
| 5,289,115 A | 2/1994 | Germer et al. |
| 5,298,854 A | 3/1994 | McEachern et al. |
| 5,298,855 A | 3/1994 | McEachern et al. |
| 5,298,856 A | 3/1994 | McEachern et al. |
| 5,298,859 A | 3/1994 | McEachern et al. |
| 5,298,885 A | 3/1994 | McEachern et al. |
| 5,298,888 A | 3/1994 | McEachern et al. |
| 5,300,924 A | 4/1994 | McEachern et al. |
| 5,301,121 A | 4/1994 | Garverick et al. |
| 5,301,122 A | 4/1994 | Halpern |
| 5,302,890 A | 4/1994 | McEachern et al. |
| 5,307,009 A | 4/1994 | McEachern et al. |
| 5,315,527 A | 5/1994 | Beckwith |
| 5,343,143 A | 8/1994 | Voisine et al. |
| 5,347,464 A | 9/1994 | McEachern et al. |
| 5,391,983 A | 2/1995 | Lusignan et al. |
| 5,402,148 A | 3/1995 | Post et al. |
| 5,406,495 A | 4/1995 | Hill |
| 5,438,257 A | 8/1995 | Berkcan |
| 5,442,279 A | 8/1995 | Kitayoshi et al. |
| 5,450,007 A | 9/1995 | Payne et al. |
| 5,453,697 A | 9/1995 | Schweer et al. |
| 5,459,395 A | 10/1995 | Berkcan |
| 5,459,459 A | 10/1995 | Lee, Jr. |
| 5,475,628 A | 12/1995 | Adams et al. |
| 5,514,958 A | 5/1996 | Germer |
| 5,528,507 A | 6/1996 | McNamara et al. |
| 5,537,340 A | 7/1996 | Gawlik |
| 5,544,064 A | 8/1996 | Beckwith |
| 5,548,527 A | 8/1996 | Hemminger et al. |
| 5,555,508 A | 9/1996 | Munday et al. |
| 5,559,719 A | 9/1996 | Johnson et al. |
| 5,563,506 A | 10/1996 | Fielden et al. |
| 5,568,047 A | 10/1996 | Staver et al. |
| 5,572,438 A | 11/1996 | Ehlers et al. |
| 5,574,654 A | 11/1996 | Bingham et al. |
| 5,581,173 A | 12/1996 | Yalla et al. |
| 5,592,165 A | 1/1997 | Jackson et al. |
| 5,606,510 A | 2/1997 | Glaser et al. |
| 5,619,142 A | 4/1997 | Schweer et al. |
| 5,627,759 A | 5/1997 | Bearden et al. |
| 5,642,300 A | 6/1997 | Gubisch et al. |

(56) References Cited

U.S. PATENT DOCUMENTS

| | | |
|---|---|---|
| 5,650,936 A | 7/1997 | Loucks et al. |
| 5,675,754 A | 10/1997 | King et al. |
| 5,706,204 A | 1/1998 | Cox et al. |
| 5,706,214 A | 1/1998 | Putt et al. |
| 5,734,571 A | 3/1998 | Pilz et al. |
| 5,736,847 A | 4/1998 | Van Doorn et al. |
| 5,737,231 A | 4/1998 | Pyle et al. |
| 5,757,357 A | 5/1998 | Grande et al. |
| 5,764,523 A | 6/1998 | Yoshinaga et al. |
| 5,768,632 A | 6/1998 | Husted et al. |
| 5,774,366 A | 6/1998 | Beckwith |
| 5,796,977 A | 8/1998 | Sarangdhar et al. |
| 5,801,643 A | 9/1998 | Williams et al. |
| 5,819,203 A | 10/1998 | Moore et al. |
| 5,822,165 A | 10/1998 | Moran |
| 5,828,576 A | 10/1998 | Loucks et al. |
| 5,832,210 A | 11/1998 | Akiyama et al. |
| 5,862,391 A * | 1/1999 | Salas .................. G01D 4/002 713/300 |
| 5,874,903 A | 2/1999 | Shuey et al. |
| 5,890,097 A | 3/1999 | Cox |
| 5,892,758 A | 4/1999 | Argyroudis |
| 5,896,547 A | 4/1999 | Lee |
| 5,897,607 A | 4/1999 | Jenney et al. |
| 5,898,387 A | 4/1999 | Davis et al. |
| 5,899,960 A | 5/1999 | Moore et al. |
| 5,907,238 A | 5/1999 | Owerko et al. |
| 5,933,029 A | 8/1999 | Kuroda et al. |
| 5,952,819 A | 9/1999 | Berkcan et al. |
| 5,963,734 A | 10/1999 | Ackerman et al. |
| 5,978,655 A | 11/1999 | Ohura et al. |
| 5,986,574 A | 11/1999 | Colton |
| 5,994,892 A | 11/1999 | Turino et al. |
| 5,995,911 A | 11/1999 | Hart |
| 6,000,034 A | 12/1999 | Lightbody et al. |
| 6,011,519 A | 1/2000 | Sadler et al. |
| 6,018,690 A | 1/2000 | Saito et al. |
| 6,018,700 A | 1/2000 | Edel |
| 6,023,160 A | 2/2000 | Coburn |
| 6,028,857 A | 2/2000 | Poor |
| 6,032,109 A | 2/2000 | Ritmiller, III |
| 6,038,516 A | 3/2000 | Alexander et al. |
| 6,041,257 A | 3/2000 | MacDuff et al. |
| 6,064,192 A | 5/2000 | Redmyer |
| 6,073,169 A | 6/2000 | Shuey et al. |
| D427,533 S | 7/2000 | Cowan et al. |
| D429,655 S | 8/2000 | Cowan et al. |
| 6,098,175 A | 8/2000 | Lee |
| 6,100,817 A | 8/2000 | Mason, Jr. et al. |
| 6,112,136 A | 8/2000 | Paul et al. |
| 6,121,593 A | 9/2000 | Mansbery et al. |
| 6,133,720 A | 10/2000 | Elmore |
| 6,151,653 A | 11/2000 | Lin et al. |
| D435,471 S | 12/2000 | Simbeck et al. |
| 6,157,329 A | 12/2000 | Lee et al. |
| 6,163,243 A | 12/2000 | Titus |
| 6,167,329 A | 12/2000 | Engel et al. |
| 6,185,508 B1 | 2/2001 | Van Doorn et al. |
| 6,186,842 B1 | 2/2001 | Hirschbold et al. |
| 6,195,614 B1 | 2/2001 | Kochan |
| D439,535 S | 3/2001 | Cowan et al. |
| 6,236,949 B1 | 5/2001 | Hart |
| D443,541 S | 6/2001 | Hancock et al. |
| 6,262,672 B1 | 7/2001 | Brooksby et al. |
| 6,269,316 B1 | 7/2001 | Hubbard et al. |
| 6,279,037 B1 | 8/2001 | Tams et al. |
| 6,289,267 B1 | 9/2001 | Alexander et al. |
| 6,292,717 B1 | 9/2001 | Alexander et al. |
| 6,301,527 B1 | 10/2001 | Butland et al. |
| 6,343,299 B1 | 1/2002 | Huang et al. |
| 6,363,057 B1 | 3/2002 | Ardalan et al. |
| 6,374,084 B1 | 4/2002 | Fok |
| 6,396,421 B1 | 5/2002 | Bland |
| 6,396,839 B1 | 5/2002 | Ardalan et al. |
| 6,397,155 B1 | 5/2002 | Przydatek et al. |
| D458,863 S | 6/2002 | Harding et al. |
| D459,259 S | 6/2002 | Harding et al. |
| 6,401,054 B1 | 6/2002 | Andersen |
| 6,405,128 B1 | 6/2002 | Bechtolsheim et al. |
| 6,415,244 B1 | 7/2002 | Dickens et al. |
| 6,417,661 B1 | 7/2002 | Berkcan et al. |
| 6,418,450 B2 | 7/2002 | Daudenarde |
| 6,423,960 B1 | 7/2002 | Engelhardt et al. |
| 6,429,637 B1 | 8/2002 | Gandhi |
| 6,433,981 B1 | 8/2002 | Fletcher et al. |
| 6,437,692 B1 | 8/2002 | Petite et al. |
| 6,438,651 B1 | 8/2002 | Slane |
| 6,444,971 B1 | 9/2002 | Engelhardt et al. |
| 6,479,976 B1 | 11/2002 | Edel |
| 6,483,291 B1 | 11/2002 | Bhateja et al. |
| 6,493,644 B1 | 12/2002 | Jonker et al. |
| 6,496,511 B1 | 12/2002 | Wang et al. |
| 6,509,850 B1 | 1/2003 | Bland |
| 6,519,537 B1 | 2/2003 | Yang |
| 6,522,517 B1 | 2/2003 | Edel |
| 6,526,581 B1 * | 2/2003 | Edson .................. H02J 7/0065 348/552 |
| 6,528,957 B1 | 3/2003 | Luchaco |
| 6,538,577 B1 | 3/2003 | Ehrke et al. |
| 6,542,838 B1 | 4/2003 | Haddad et al. |
| 6,553,418 B1 | 4/2003 | Collins et al. |
| 6,563,697 B1 | 5/2003 | Simbeck et al. |
| 6,564,332 B1 | 5/2003 | Nguyen et al. |
| 6,565,608 B1 | 5/2003 | Fein et al. |
| 6,577,642 B1 | 6/2003 | Fijolek et al. |
| 6,590,380 B2 | 7/2003 | Edel |
| 6,611,773 B2 | 8/2003 | Przydatek et al. |
| 6,611,922 B2 | 8/2003 | Ozcetin et al. |
| 6,615,147 B1 | 9/2003 | Jonker et al. |
| 6,621,433 B1 | 9/2003 | Hertz |
| 6,636,030 B1 | 10/2003 | Rose et al. |
| 6,639,538 B1 | 10/2003 | Sechi et al. |
| 6,657,552 B2 | 12/2003 | Belski et al. |
| 6,661,357 B2 | 12/2003 | Bland |
| 6,671,635 B1 | 12/2003 | Forth et al. |
| 6,671,654 B1 | 12/2003 | Forth et al. |
| 6,671,802 B1 | 12/2003 | Ott |
| 6,674,379 B1 | 1/2004 | Li et al. |
| 6,687,627 B1 | 2/2004 | Gunn et al. |
| 6,694,270 B2 | 2/2004 | Hart |
| 6,701,264 B2 | 3/2004 | Caso et al. |
| 6,714,881 B2 | 3/2004 | Carlson et al. |
| 6,717,394 B2 | 4/2004 | Elms |
| 6,732,124 B1 | 5/2004 | Koseki et al. |
| 6,735,535 B1 * | 5/2004 | Kagan .................. G01R 21/133 324/142 |
| 6,737,855 B2 | 5/2004 | Huber et al. |
| 6,745,138 B2 | 6/2004 | Przydatek et al. |
| 6,751,562 B2 | 6/2004 | Blackett et al. |
| 6,751,563 B2 | 6/2004 | Spanier et al. |
| 6,757,628 B1 | 6/2004 | Anderson et al. |
| 6,759,837 B2 | 7/2004 | Gandhi |
| 6,762,675 B1 | 7/2004 | Cafiero et al. |
| 6,792,337 B2 * | 9/2004 | Blackett .................. G01D 4/00 700/295 |
| 6,792,364 B2 | 9/2004 | Jonker et al. |
| 6,798,190 B2 | 9/2004 | Harding et al. |
| 6,798,191 B1 | 9/2004 | Macfarlane et al. |
| 6,801,865 B2 | 10/2004 | Gilgenbach et al. |
| 6,813,571 B2 | 11/2004 | Lightbody et al. |
| 6,817,890 B1 | 11/2004 | Schindler |
| 6,825,776 B2 | 11/2004 | Lightbody et al. |
| 6,829,267 B2 | 12/2004 | Vaughan et al. |
| 6,836,737 B2 | 12/2004 | Petite et al. |
| 6,842,707 B2 | 1/2005 | Raichle et al. |
| 6,853,978 B2 | 2/2005 | Forth et al. |
| 6,871,150 B2 | 3/2005 | Huber et al. |
| D505,087 S | 5/2005 | Ricci et al. |
| 6,894,979 B1 | 5/2005 | Lee |
| 6,900,738 B2 | 5/2005 | Crichlow |
| 6,934,754 B2 | 8/2005 | West et al. |
| 6,944,555 B2 | 9/2005 | Blackett et al. |
| 6,957,158 B1 | 10/2005 | Hancock et al. |
| 6,957,275 B1 | 10/2005 | Sekiguchi |

(56) References Cited

U.S. PATENT DOCUMENTS

| | | | |
|---|---|---|---|
| 6,961,641 B1 | 11/2005 | Forth et al. | |
| 6,963,195 B1 | 11/2005 | Berkcan | |
| 6,972,364 B2 | 12/2005 | Diedrichsen | |
| 6,975,209 B2 | 12/2005 | Gromov | |
| 6,983,211 B2 | 1/2006 | Cowan et al. | |
| 6,985,087 B2 | 1/2006 | Soliman | |
| 6,988,025 B2 | 1/2006 | Ransom et al. | |
| 6,988,043 B1 | 1/2006 | Randall | |
| 6,988,182 B2 | 1/2006 | Teachman et al. | |
| 6,989,735 B2 | 1/2006 | Fisher et al. | |
| 6,990,395 B2 | 1/2006 | Ransom et al. | |
| 7,006,934 B2 | 2/2006 | Jonker et al. | |
| 7,010,438 B2 | 3/2006 | Hancock et al. | |
| 7,035,593 B2 | 4/2006 | Miller et al. | |
| 7,043,459 B2 | 5/2006 | Peevey | |
| 7,047,216 B2 | 5/2006 | Kashti | |
| 7,049,975 B2 | 5/2006 | Vanderah et al. | |
| 7,050,808 B2 | 5/2006 | Janusz et al. | |
| 7,050,916 B2 | 5/2006 | Curtis et al. | |
| 7,072,779 B2 | 7/2006 | Hancock et al. | |
| 7,085,824 B2 | 8/2006 | Forth et al. | |
| 7,089,089 B2 * | 8/2006 | Cumming | G01D 4/004 700/295 |
| 7,126,439 B2 | 10/2006 | Qi et al. | |
| 7,126,493 B2 | 10/2006 | Junker et al. | |
| 7,127,328 B2 | 10/2006 | Ransom | |
| 7,129,848 B2 | 10/2006 | Milliot et al. | |
| D532,747 S | 11/2006 | Ricci et al. | |
| 7,135,956 B2 | 11/2006 | Bartone et al. | |
| 7,136,384 B1 | 11/2006 | Wang | |
| D534,120 S | 12/2006 | Ricci et al. | |
| 7,155,350 B2 | 12/2006 | Kagan | |
| 7,158,050 B2 | 1/2007 | Lightbody et al. | |
| 7,171,467 B2 | 1/2007 | Carley | |
| 7,174,258 B2 | 2/2007 | Hart | |
| 7,174,261 B2 | 2/2007 | Gunn et al. | |
| 7,184,904 B2 | 2/2007 | Kagan | |
| 7,188,003 B2 | 3/2007 | Ransom et al. | |
| 7,191,076 B2 | 3/2007 | Huber et al. | |
| 7,196,673 B2 | 3/2007 | Savage et al. | |
| 7,203,319 B2 | 4/2007 | Ben-Zur et al. | |
| 7,203,736 B1 * | 4/2007 | Burnett | H04L 12/2803 709/219 |
| 7,209,804 B2 | 4/2007 | Curt et al. | |
| 7,216,043 B2 | 5/2007 | Ransom et al. | |
| 7,239,184 B2 | 7/2007 | Cetrulo et al. | |
| 7,243,050 B2 | 7/2007 | Armstrong | |
| 7,246,014 B2 | 7/2007 | Forth et al. | |
| 7,248,977 B2 | 7/2007 | Hart | |
| 7,248,978 B2 | 7/2007 | Ransom | |
| 7,249,265 B2 | 7/2007 | Von Carolsfeld et al. | |
| 7,256,709 B2 | 8/2007 | Kagan | |
| 7,257,107 B2 | 8/2007 | Swier, Jr. et al. | |
| 7,271,996 B2 | 9/2007 | Kagan et al. | |
| 7,294,997 B2 | 11/2007 | Kagan | |
| 7,299,308 B2 | 11/2007 | Kondo et al. | |
| 7,304,586 B2 | 12/2007 | Wang et al. | |
| 7,304,829 B2 | 12/2007 | Nadipuram et al. | |
| 7,305,310 B2 | 12/2007 | Slota et al. | |
| 7,313,176 B1 | 12/2007 | Groen | |
| 7,337,081 B1 | 2/2008 | Kagan | |
| 7,342,507 B2 | 3/2008 | Jonker et al. | |
| 7,346,786 B1 | 3/2008 | Dimick et al. | |
| 7,359,809 B2 | 4/2008 | Bruno | |
| 7,369,950 B2 | 5/2008 | Wall et al. | |
| 7,372,574 B2 | 5/2008 | Sanders et al. | |
| 7,379,997 B2 | 5/2008 | Ehlers et al. | |
| 7,395,323 B2 | 7/2008 | Larson et al. | |
| 7,409,303 B2 | 8/2008 | Yeo et al. | |
| 7,415,368 B2 | 8/2008 | Gilbert et al. | |
| 7,436,687 B2 | 10/2008 | Patel | |
| 7,444,454 B2 | 10/2008 | Yancey et al. | |
| 7,447,760 B2 | 11/2008 | Forth et al. | |
| 7,447,762 B2 | 11/2008 | Curray et al. | |
| 7,486,624 B2 | 2/2009 | Shaw et al. | |
| 7,511,468 B2 | 3/2009 | McEachern et al. | |
| 7,514,907 B2 | 4/2009 | Rajda et al. | |
| 7,554,320 B2 | 6/2009 | Kagan | |
| 7,577,542 B2 | 8/2009 | Vacar et al. | |
| 7,616,656 B2 | 11/2009 | Wang et al. | |
| 7,630,863 B2 | 12/2009 | Zweigle et al. | |
| 7,660,682 B2 | 2/2010 | Slota et al. | |
| 7,739,728 B1 | 6/2010 | Koehler et al. | |
| 7,761,910 B2 | 7/2010 | Ransom et al. | |
| 7,765,127 B2 | 7/2010 | Banks et al. | |
| 7,813,822 B1 | 10/2010 | Hoffberg | |
| 7,877,169 B2 | 1/2011 | Slota et al. | |
| 7,881,907 B2 | 2/2011 | Curt et al. | |
| 7,899,630 B2 | 3/2011 | Kagan | |
| 7,916,015 B1 | 3/2011 | Evancich et al. | |
| 7,916,060 B2 | 3/2011 | Zhu et al. | |
| 7,920,976 B2 | 4/2011 | Banhegyesi | |
| 7,921,199 B1 | 4/2011 | Shirriff et al. | |
| 7,953,899 B1 | 5/2011 | Hooper | |
| 7,961,736 B2 | 6/2011 | Ayyagar | |
| 7,962,298 B2 | 6/2011 | Przydatek et al. | |
| 7,974,713 B2 | 7/2011 | Disch et al. | |
| 7,996,171 B2 | 8/2011 | Banhegyesi | |
| 7,999,696 B2 | 8/2011 | Wang et al. | |
| 8,019,836 B2 | 9/2011 | Elliott et al. | |
| 8,022,690 B2 | 9/2011 | Kagan | |
| 8,024,073 B2 | 9/2011 | Imes et al. | |
| 8,037,173 B2 | 10/2011 | Tuckey et al. | |
| 8,063,704 B2 | 11/2011 | Wu et al. | |
| 8,073,642 B2 | 12/2011 | Slota et al. | |
| 8,078,418 B2 | 12/2011 | Banhegyesi et al. | |
| 8,107,491 B2 | 1/2012 | Wang et al. | |
| 8,121,801 B2 | 2/2012 | Spanier et al. | |
| 8,160,824 B2 | 4/2012 | Spanier et al. | |
| 8,190,381 B2 | 5/2012 | Spanier et al. | |
| 8,193,929 B1 | 6/2012 | Siu et al. | |
| 8,250,246 B2 | 8/2012 | Brockmann et al. | |
| 8,269,482 B2 | 9/2012 | Banhegyesi | |
| 8,335,936 B2 | 12/2012 | Jonsson et al. | |
| 8,402,267 B1 | 3/2013 | Graham et al. | |
| 8,442,660 B2 | 5/2013 | Kagan | |
| 8,515,348 B2 | 8/2013 | Kagan | |
| 8,599,036 B2 | 12/2013 | Wang et al. | |
| 8,620,608 B2 | 12/2013 | Banhegyesi et al. | |
| 8,635,036 B2 | 1/2014 | Pamulaparthy et al. | |
| 8,666,688 B2 | 3/2014 | Spanier et al. | |
| 8,700,347 B2 | 4/2014 | Spanier et al. | |
| 8,717,007 B2 | 5/2014 | Banhegyesi | |
| 8,797,202 B2 | 8/2014 | Zhu et al. | |
| 8,812,979 B2 | 8/2014 | Khanke et al. | |
| 8,862,435 B2 | 10/2014 | Spanier et al. | |
| 8,878,517 B2 | 11/2014 | Banhegyesi | |
| 8,930,153 B2 | 1/2015 | Kagan et al. | |
| 8,933,815 B2 | 1/2015 | Kagan et al. | |
| 9,080,894 B2 | 7/2015 | Spanier et al. | |
| 9,094,227 B2 | 7/2015 | Park | |
| 9,194,898 B2 | 11/2015 | Banhegyesi et al. | |
| 9,310,792 B2 | 4/2016 | Lu et al. | |
| 9,482,555 B2 | 11/2016 | Spanier et al. | |
| 9,696,180 B2 | 7/2017 | Kagan | |
| 9,903,895 B2 | 2/2018 | Banhegyesi et al. | |
| 9,989,618 B2 | 6/2018 | Spanier et al. | |
| 2001/0038343 A1 | 11/2001 | Meyer et al. | |
| 2001/0038689 A1 | 11/2001 | Liljestrand et al. | |
| 2002/0014884 A1 * | 2/2002 | Chung | G01D 4/004 324/74 |
| 2002/0018399 A1 | 2/2002 | Schultz et al. | |
| 2002/0024453 A1 | 2/2002 | Maeda | |
| 2002/0026957 A1 * | 3/2002 | Reyman | F16K 17/36 137/39 |
| 2002/0032535 A1 | 3/2002 | Alexander et al. | |
| 2002/0048269 A1 | 4/2002 | Hong et al. | |
| 2002/0052972 A1 | 5/2002 | Yim | |
| 2002/0065872 A1 | 5/2002 | Genske et al. | |
| 2002/0072868 A1 * | 6/2002 | Bartone | H02J 3/14 702/62 |
| 2002/0073211 A1 | 6/2002 | Lin et al. | |
| 2002/0091784 A1 | 7/2002 | Baker et al. | |
| 2002/0105435 A1 | 8/2002 | Yee et al. | |

(56) References Cited

U.S. PATENT DOCUMENTS

| | | |
|---|---|---|
| 2002/0109608 A1 | 8/2002 | Petite et al. |
| 2002/0114326 A1 | 8/2002 | Mahalingaiah |
| 2002/0120723 A1 | 8/2002 | Forth et al. |
| 2002/0129342 A1 | 9/2002 | Kil et al. |
| 2002/0133504 A1 | 9/2002 | Vlahos et al. |
| 2002/0161536 A1 | 10/2002 | Suh et al. |
| 2002/0162014 A1 | 10/2002 | Przydatek et al. |
| 2002/0165677 A1 | 11/2002 | Lightbody et al. |
| 2002/0169570 A1 | 11/2002 | Spanier et al. |
| 2002/0173927 A1 | 11/2002 | Vandiver |
| 2002/0174223 A1 | 11/2002 | Childers et al. |
| 2002/0180420 A1 | 12/2002 | Lavoie et al. |
| 2002/0188706 A1 | 12/2002 | Richards et al. |
| 2003/0005130 A1 | 1/2003 | Cheng |
| 2003/0009401 A1 | 1/2003 | Ellis |
| 2003/0014200 A1 | 1/2003 | Jonker et al. |
| 2003/0018982 A1 | 1/2003 | Zeidler et al. |
| 2003/0025620 A1 | 2/2003 | Bland |
| 2003/0065459 A1 | 4/2003 | Huber et al. |
| 2003/0065757 A1 | 4/2003 | Mentze et al. |
| 2003/0076247 A1 | 4/2003 | Bland |
| 2003/0084112 A1 | 5/2003 | Curray et al. |
| 2003/0084280 A1 | 5/2003 | Bryan et al. |
| 2003/0093429 A1 | 5/2003 | Nishikawa et al. |
| 2003/0101008 A1 | 5/2003 | Hart |
| 2003/0105608 A1 | 6/2003 | Hart |
| 2003/0110380 A1 | 6/2003 | Carolsfeld et al. |
| 2003/0132742 A1 | 7/2003 | Harding et al. |
| 2003/0154471 A1 | 8/2003 | Teachman et al. |
| 2003/0163508 A1 | 8/2003 | Goodman |
| 2003/0176952 A1 | 9/2003 | Collins et al. |
| 2003/0178982 A1 | 9/2003 | Elms |
| 2003/0178985 A1 | 9/2003 | Briese et al. |
| 2003/0179714 A1 | 9/2003 | Gilgenbach et al. |
| 2003/0185110 A1 | 10/2003 | Fujisawa |
| 2003/0187550 A1 | 10/2003 | Wilson et al. |
| 2003/0200285 A1 | 10/2003 | Hansen et al. |
| 2003/0204756 A1 | 10/2003 | Ransom et al. |
| 2003/0210699 A1 | 11/2003 | Holt et al. |
| 2003/0212512 A1 | 11/2003 | Hart |
| 2003/0220752 A1 | 11/2003 | Hart |
| 2003/0226058 A1 | 12/2003 | Miller et al. |
| 2004/0049524 A1 | 3/2004 | Toyota et al. |
| 2004/0064198 A1* | 4/2004 | Reynolds ............... G06F 1/266 700/17 |
| 2004/0066311 A1 | 4/2004 | Giles et al. |
| 2004/0078474 A1 | 4/2004 | Ramaswamy |
| 2004/0083066 A1 | 4/2004 | Hayes et al. |
| 2004/0098459 A1 | 5/2004 | Leukert-Knapp et al. |
| 2004/0107025 A1 | 6/2004 | Ransom et al. |
| 2004/0113810 A1 | 6/2004 | Mason et al. |
| 2004/0122833 A1* | 6/2004 | Forth ..................... G01D 4/004 |
| 2004/0128260 A1 | 7/2004 | Amedure et al. |
| 2004/0138786 A1 | 7/2004 | Blackett et al. |
| 2004/0138787 A1 | 7/2004 | Ransom et al. |
| 2004/0138834 A1 | 7/2004 | Blackett et al. |
| 2004/0138835 A1 | 7/2004 | Ransom et al. |
| 2004/0153594 A1 | 8/2004 | Rotvoid et al. |
| 2004/0162642 A1 | 8/2004 | Gasper et al. |
| 2004/0167686 A1 | 8/2004 | Baker et al. |
| 2004/0170181 A1 | 9/2004 | Bogdon et al. |
| 2004/0172207 A1 | 9/2004 | Hancock et al. |
| 2004/0177062 A1 | 9/2004 | Urquhart et al. |
| 2004/0183522 A1 | 9/2004 | Gunn et al. |
| 2004/0187028 A1 | 9/2004 | Perkins et al. |
| 2004/0193329 A1 | 9/2004 | Ransom et al. |
| 2004/0208182 A1 | 10/2004 | Boles et al. |
| 2004/0229578 A1 | 11/2004 | Lightbody et al. |
| 2004/0243735 A1 | 12/2004 | Rosenbloom et al. |
| 2004/0250059 A1 | 12/2004 | Ramelson et al. |
| 2005/0017874 A1 | 1/2005 | Lightbody et al. |
| 2005/0021252 A1* | 1/2005 | Hui ....................... G06F 1/266 702/60 |
| 2005/0027464 A1 | 2/2005 | Jonker et al. |
| 2005/0033956 A1 | 2/2005 | Krempl |
| 2005/0039040 A1 | 2/2005 | Ransom et al. |
| 2005/0060110 A1 | 3/2005 | Jones et al. |
| 2005/0071106 A1 | 3/2005 | Huber et al. |
| 2005/0093571 A1 | 5/2005 | Suaris et al. |
| 2005/0138421 A1 | 6/2005 | Fedronic et al. |
| 2005/0138432 A1 | 6/2005 | Ransom et al. |
| 2005/0144437 A1 | 6/2005 | Ransom et al. |
| 2005/0165585 A1 | 7/2005 | Bhateja et al. |
| 2005/0169309 A1 | 8/2005 | Tripathi et al. |
| 2005/0183128 A1 | 8/2005 | Assayag et al. |
| 2005/0187725 A1 | 8/2005 | Cox |
| 2005/0202808 A1 | 9/2005 | Fishman et al. |
| 2005/0220079 A1 | 10/2005 | Asokan |
| 2005/0240362 A1 | 10/2005 | Randall |
| 2005/0240540 A1 | 10/2005 | Borleske et al. |
| 2005/0243204 A1 | 11/2005 | Zhu |
| 2005/0273183 A1* | 12/2005 | Curt .................... H02J 13/0006 700/22 |
| 2005/0273280 A1 | 12/2005 | Cox |
| 2005/0273281 A1 | 12/2005 | Wall et al. |
| 2005/0275397 A1 | 12/2005 | Lightbody et al. |
| 2005/0288876 A1 | 12/2005 | Doig et al. |
| 2005/0288877 A1 | 12/2005 | Doig et al. |
| 2006/0020405 A1* | 1/2006 | Kagan .................. G01R 21/133 702/61 |
| 2006/0020634 A1 | 1/2006 | Huras et al. |
| 2006/0020788 A1 | 1/2006 | Han et al. |
| 2006/0047787 A1 | 3/2006 | Agarwal et al. |
| 2006/0049694 A1* | 3/2006 | Kates ...................... H02J 3/14 307/132 E |
| 2006/0052958 A1 | 3/2006 | Hancock et al. |
| 2006/0066456 A1 | 3/2006 | Jonker et al. |
| 2006/0066903 A1 | 3/2006 | Shiimori |
| 2006/0071813 A1 | 4/2006 | Kagan |
| 2006/0077999 A1 | 4/2006 | Kagan et al. |
| 2006/0083260 A1 | 4/2006 | Wang et al. |
| 2006/0085419 A1 | 4/2006 | Rosen |
| 2006/0086893 A1 | 4/2006 | Spanier et al. |
| 2006/0095219 A1 | 5/2006 | Bruno |
| 2006/0116842 A1 | 6/2006 | Tarantola et al. |
| 2006/0145890 A1 | 7/2006 | Junker et al. |
| 2006/0155422 A1 | 7/2006 | Uy et al. |
| 2006/0155442 A1 | 7/2006 | Luo et al. |
| 2006/0161360 A1 | 7/2006 | Yao et al. |
| 2006/0161400 A1 | 7/2006 | Kagan |
| 2006/0170409 A1 | 8/2006 | Kagan et al. |
| 2006/0187956 A1 | 8/2006 | Doviak et al. |
| 2006/0200599 A1 | 9/2006 | Manchester et al. |
| 2006/0206433 A1 | 9/2006 | Scoggins |
| 2006/0224336 A1 | 10/2006 | Petras et al. |
| 2006/0230394 A1 | 10/2006 | Forth et al. |
| 2006/0267560 A1 | 11/2006 | Rajda et al. |
| 2006/0271244 A1 | 11/2006 | Cumming et al. |
| 2006/0271314 A1 | 11/2006 | Hayes |
| 2006/0274899 A1 | 12/2006 | Zhu et al. |
| 2007/0047735 A1 | 3/2007 | Celli et al. |
| 2007/0055889 A1 | 3/2007 | Henneberry et al. |
| 2007/0058634 A1 | 3/2007 | Gupta et al. |
| 2007/0061786 A1 | 3/2007 | Zhou et al. |
| 2007/0067119 A1 | 3/2007 | Loewen et al. |
| 2007/0067121 A1 | 3/2007 | Przydatek et al. |
| 2007/0081597 A1 | 4/2007 | Disch et al. |
| 2007/0096765 A1 | 5/2007 | Kagan |
| 2007/0096942 A1 | 5/2007 | Kagan et al. |
| 2007/0112446 A1 | 5/2007 | Deveaux et al. |
| 2007/0114987 A1 | 5/2007 | Kagan |
| 2007/0120705 A1 | 5/2007 | Kiiskila et al. |
| 2007/0136010 A1 | 6/2007 | Gunn et al. |
| 2007/0152058 A1 | 7/2007 | Yeakley et al. |
| 2007/0156915 A1 | 7/2007 | Neishi |
| 2007/0186111 A1 | 8/2007 | Durand |
| 2007/0233323 A1 | 10/2007 | Wiemeyer et al. |
| 2007/0240159 A1 | 10/2007 | Sugiyama |
| 2007/0263643 A1 | 11/2007 | Wadhawan |
| 2007/0266004 A1 | 11/2007 | Wall et al. |
| 2008/0028395 A1 | 1/2008 | Motta et al. |
| 2008/0046205 A1 | 2/2008 | Gilbert et al. |
| 2008/0052384 A1 | 2/2008 | Marl et al. |
| 2008/0065335 A1 | 3/2008 | Doig et al. |

(56) References Cited

U.S. PATENT DOCUMENTS

| | | |
|---|---|---|
| 2008/0071482 A1 | 3/2008 | Zweigle et al. |
| 2008/0075194 A1 | 3/2008 | Ravi et al. |
| 2008/0086222 A1 | 4/2008 | Kagan |
| 2008/0091770 A1 | 4/2008 | Petras et al. |
| 2008/0103631 A1 | 5/2008 | Koliwad et al. |
| 2008/0104149 A1 | 5/2008 | Vishniac et al. |
| 2008/0127210 A1 | 5/2008 | Bosold et al. |
| 2008/0130639 A1 | 6/2008 | Costa-Requena et al. |
| 2008/0147334 A1 | 6/2008 | Kagan |
| 2008/0158008 A1 | 7/2008 | Kagan et al. |
| 2008/0168434 A1 | 7/2008 | Gee et al. |
| 2008/0172192 A1 | 7/2008 | Banhegyesi |
| 2008/0187116 A1 | 8/2008 | Reeves et al. |
| 2008/0195562 A1 | 8/2008 | Worth et al. |
| 2008/0195794 A1 | 8/2008 | Banker |
| 2008/0201723 A1 | 8/2008 | Bottaro et al. |
| 2008/0215264 A1 | 9/2008 | Spanier et al. |
| 2008/0228830 A1 | 9/2008 | Hawtin |
| 2008/0234957 A1 | 9/2008 | Banhegyesi et al. |
| 2008/0235355 A1 | 9/2008 | Spanier et al. |
| 2008/0238406 A1 | 10/2008 | Banhegyesi |
| 2008/0238713 A1 | 10/2008 | Banhegyesi et al. |
| 2008/0240140 A1 | 10/2008 | Dabagh et al. |
| 2008/0243404 A1 | 10/2008 | Banhegyesi |
| 2008/0252481 A1 | 10/2008 | Vacar et al. |
| 2009/0012728 A1 | 1/2009 | Spanier et al. |
| 2009/0055912 A1 | 2/2009 | Choi et al. |
| 2009/0066528 A1 | 3/2009 | Bickel et al. |
| 2009/0070168 A1 | 3/2009 | Thompson et al. |
| 2009/0072813 A1 | 3/2009 | Banhegyesi |
| 2009/0082879 A1 | 3/2009 | Dooley et al. |
| 2009/0094317 A1 | 4/2009 | Venkitaraman |
| 2009/0096654 A1 | 4/2009 | Zhu et al. |
| 2009/0115626 A1 | 5/2009 | Vaswani et al. |
| 2009/0172455 A1 | 7/2009 | Pind |
| 2009/0172519 A1 | 7/2009 | Xu et al. |
| 2009/0196206 A1 | 8/2009 | Weaver et al. |
| 2009/0228224 A1 | 9/2009 | Spanier et al. |
| 2009/0235075 A1 | 9/2009 | Cho et al. |
| 2009/0235090 A1 | 9/2009 | Chang |
| 2009/0247146 A1 | 10/2009 | Wesby |
| 2009/0265124 A1 | 10/2009 | Kagan |
| 2009/0276102 A1 | 11/2009 | Smith et al. |
| 2009/0292894 A1 | 11/2009 | Henry et al. |
| 2009/0300165 A1 | 12/2009 | Tuckey et al. |
| 2010/0004350 A1 | 1/2010 | Zalich et al. |
| 2010/0054276 A1 | 3/2010 | Wang et al. |
| 2010/0057387 A1 | 3/2010 | Kagan et al. |
| 2010/0057628 A1 | 3/2010 | Trinidad et al. |
| 2010/0073192 A1 | 3/2010 | Goldfisher et al. |
| 2010/0094851 A1 | 4/2010 | Bent et al. |
| 2010/0121996 A1 | 5/2010 | Schmidt et al. |
| 2010/0153036 A1 | 6/2010 | Elwarry et al. |
| 2010/0169709 A1 | 7/2010 | Chiu et al. |
| 2010/0169876 A1 | 7/2010 | Mann |
| 2010/0238003 A1 | 9/2010 | Chan et al. |
| 2010/0278187 A1 | 11/2010 | Hart et al. |
| 2010/0299441 A1 | 11/2010 | Hughes et al. |
| 2010/0324845 A1 | 12/2010 | Spanier et al. |
| 2011/0004350 A1 | 1/2011 | Cheifetz et al. |
| 2011/0004426 A1 | 1/2011 | Wright et al. |
| 2011/0015961 A1 | 1/2011 | Chan |
| 2011/0016021 A1 | 1/2011 | Manning |
| 2011/0029461 A1 | 2/2011 | Hardin, Jr. |
| 2011/0040809 A1 | 2/2011 | Spanier et al. |
| 2011/0069709 A1 | 3/2011 | Morris et al. |
| 2011/0093843 A1 | 4/2011 | Endo et al. |
| 2011/0106589 A1 | 5/2011 | Blomberg et al. |
| 2011/0107357 A1 | 5/2011 | Cullimore |
| 2011/0119673 A1 | 5/2011 | Bloch et al. |
| 2011/0153697 A1 | 6/2011 | Nickolov et al. |
| 2011/0158244 A1 | 6/2011 | Long et al. |
| 2011/0178651 A1 | 7/2011 | Choi et al. |
| 2011/0184671 A1 | 7/2011 | Abiprojo et al. |
| 2011/0260710 A1 | 10/2011 | Zhu et al. |
| 2011/0270551 A1 | 11/2011 | Kagan et al. |
| 2011/0282508 A1 | 11/2011 | Goutard et al. |
| 2012/0025807 A1 | 2/2012 | Banhegyesi |
| 2012/0041696 A1 | 2/2012 | Sanderford et al. |
| 2012/0059932 A1 | 3/2012 | Messer et al. |
| 2012/0078547 A1 | 3/2012 | Murdoch |
| 2012/0079471 A1 | 3/2012 | Vidal et al. |
| 2012/0099478 A1 | 4/2012 | Fu et al. |
| 2012/0126995 A1 | 5/2012 | Sobotka et al. |
| 2012/0209057 A1 | 8/2012 | Siess et al. |
| 2012/0209552 A1 | 8/2012 | Spanier et al. |
| 2012/0209557 A1 | 8/2012 | Crandall et al. |
| 2012/0265357 A1 | 10/2012 | Song et al. |
| 2012/0299744 A1 | 11/2012 | Sfaelos |
| 2013/0019042 A1 | 1/2013 | Ertugay et al. |
| 2013/0055389 A1 | 2/2013 | Alvarez et al. |
| 2013/0066965 A1 | 3/2013 | Foti |
| 2013/0073059 A1 | 3/2013 | Brian et al. |
| 2013/0151849 A1 | 6/2013 | Graham et al. |
| 2013/0154833 A1 | 6/2013 | Kiss et al. |
| 2013/0158918 A1 | 6/2013 | Spanier et al. |
| 2013/0318627 A1 | 11/2013 | Lundkvist et al. |
| 2014/0180613 A1 | 6/2014 | Banhegyesi et al. |
| 2014/0222357 A1 | 8/2014 | Spanier et al. |
| 2014/0277788 A1 | 9/2014 | Forbes, Jr. |
| 2015/0019148 A1 | 1/2015 | Spanier et al. |
| 2015/0089061 A1 | 3/2015 | Li et al. |
| 2015/0143108 A1 | 5/2015 | Demeter et al. |
| 2015/0172226 A1 | 6/2015 | Borshteen et al. |
| 2015/0178865 A1 | 6/2015 | Anderson et al. |
| 2015/0294013 A1 | 10/2015 | Ozer |
| 2015/0317151 A1 | 11/2015 | Falcy et al. |
| 2015/0324896 A1 | 11/2015 | Marson et al. |
| 2016/0011616 A1 | 1/2016 | Janous et al. |
| 2016/0359684 A1 | 12/2016 | Rizqi et al. |
| 2017/0039372 A1 | 2/2017 | Koval et al. |
| 2017/0147329 A1 | 5/2017 | Shutt et al. |
| 2017/0162320 A1 | 6/2017 | Rumrill |
| 2017/0180137 A1 | 6/2017 | Spanier et al. |
| 2018/0066860 A1 | 3/2018 | Carlson et al. |

FOREIGN PATENT DOCUMENTS

| | | |
|---|---|---|
| WO | 0155733 A1 | 8/2001 |
| WO | 2005059572 A1 | 6/2005 |
| WO | 2009044369 A2 | 4/2009 |
| WO | 2009044369 A3 | 5/2009 |

OTHER PUBLICATIONS

"muNet's WebGate IRIS Deployed for Utility Trials Across US", pp. 1-2 at http://www.munet.com/muNetNewPressReleases121300.htm, May 24, 2001.

"muNet's WebGate System Finds a Home on the Internet," pp. 1-2 at http://www.munet.com/muNetNewPressReleases031899.htm, May 24, 2001.

"Webgate Icis (Internet Commercial Information System)", pp. 1 at http://www.munet.com/munetproductsicisindex.htm, "Products (WebGate ICIS Internet AMR now)," pp. 1-2 at http://www.munet.com/munetproductsicis.htm, Products (Webgate ICIS Control Cenetr Software), pp. 1-2 at http://222.munet.com/munetproductsicisSpec.htm, May 24, 2001.

"Webgate Iris (Internet Residential Information System )"; http://www.munet.com/munetproducts.irisindex.html "Products," pp. 1-3; http://www.munet.com/munetproductsiris.html "Preliminary Specification" pp. 1-2; http://www.munet.com/munetproductsiris.sub.—Spec.html, May 24, 2001.

Engage Network, Inc., "Internet Protocol Card for Revenue Meters", http://www.engagenet.com. Link present as of Mar. 2000 on http://web.archive.org/web/20010306005433/www.engagenet.com/content/produ- cts.shtml.

Multi-port Communications Card (MPCC), Multi-port Ethernet Communications Card (MPE), Installation & Configuration Instructions, Power Measurement, pp. 1-9, rev. date Jul. 25, 1997.

Xu Hong, Wang Jianhua, "An Extendable Data Engine based on OPC Specification", Computer Standards & Interfaces 26 (2004) 515-525; Dec. 5, 2003.

(56) References Cited

OTHER PUBLICATIONS

Microsoft TechNet, Using DNS Servers with DHCP, Jan. 21, 2005; Accessed from https://technet.microsoft.com/en-us/library/cc787034 on Jun. 9, 2015; pp. 1-4.

"Use Excel As A Web Browser" at https://www.youtube.com/watch?v=A7LukCXev78 (Year: 2010).

Allard, Jeremie, et al., "Jini meets UPnP: an architecture for Jini/UPnP interoperability ", Proceedings of the 2003 Symposium on Applications and the Internet, 2003. IEEE, 2003, 8 pages.

Chima, Chikodi, "How Social Media Will Make the smart Energy Grid More Efficient", mashable.com, Feb. 8, 2011, pp. 1-4.

Codingfreak, "https://web.archive.org/web/201 00426123449/http://codingfreak.blogspot.com/201 0/01 /iptables-rate-l imitincoming.htm", Apr. 26, 2010.

Crockford, Douglas, "https://web.archive.org/web/20030621 080211 /http://www.crockford.com/javascript/jsmin.html", Oct. 28, 2002.

Gonzales, Jesus and Papa, Mauricio, "Passive Scanning in Modbus Networks;" 2008, in IFIP International Federation for Information Processing, vol. 253, Critical Infrastructure Protection; 2008; pp. 175-187.

HW Virtual Serial Port, "HW Virtual Serial Port" Jul. 2003, http://www.trcontrolsolutions.com/pdfs/hw_vsp_v104_en. pdf; pp. 1-4.

Microsoft, Computer Dictionary, 2002, 5th Ed. (Year: 2002) Definition of Javascript.

Natarajan "4 Easy Steps to Upgrade Linksys Wireless Router" thegeekstuff.com, 2009, 3 pages, retreived from https://www.thegeekstuff.com/2009/06/how-to-upgrade-linksys-wireless-router-firmware on Jun. 7, 2019 (Year: 2009).

Paladion, https://www.paladion.net/blogs/introduction-to-code-obfuscation, 2004 (Year: 2004).

RFC2228 FTP Security Extensions; Network Working Group, Internet Society, 1997; Retrieved from https://tools.ietf.org/html/rfc2228 Apr. 18, 2019; (Year: 1997); pp. 1-28.

UPnP Forum, "UPnP Device Architecture 1.0", Rev. Apr. 24, 2008, pp. 1-80.

White, Russ, "Working with IP addresses"; http://web.archive.org/web/20060508172602/http://www.cisco.com/web/about/ac123/ac147/archived_issues/ipj_9-1/ip_addresses.tml, May 8, 2006; Copyright 1992-2006 Cisco Systems, Inc., pp. 1-8.

Wikipedia, Burst mode (computing), https://web.archive.org/web/20081018044345/http://en wikipedia.org/wiki/Burst_mode_(computing), Oct. 18, 2008, 1 pp.

Wikipedia, File Transfer Protocol, https://web.archive.org/web/20051216071210/http:en.wikipedia.org/wiki/File_Transfer_Protocol, Dec. 16, 2005, 9 pp.

Wikipedia, Universal Plug and Play, https://web.archive.org/web/2001014015536/http://en.wikipedia.org/wiki/Universal_Plug_and_Play, Oct. 14, 2007, 14 pp.

Wikipedia, User Datagram Protocol, https://web.archive.org/web/20050823032448/https7/en. Wikipedia .org/wiki/User_Datagram_Protocol, Aug. 23, 2005, 2 pp. (Year: 2005).

Wils, Andrew, et al.,"Device discovery via residential gateways.", IEEE Transactions on Consumer Electronics, vol. 48, No. 3; Aug. 2002; pp. 478-483.

Yum, Secured Remote Data, Manual Page. 2012; Retrieved from yum.baseurl.org/wiki/securedRemoteData on Apr. 18, 2019. (Dated Reference from Archive.org attached) (Year: 2012) pp. 1-2.

Zhang, Chun, et al., "On supporting containment queries in relational database management systems ", ACM SIGMOD Record. Vol 30. No.2. ACM, 2001; pp. 425-436.

ION Technology, 7500 ION 7600 ION High Visibility Energy & Power Quality Compliance Meters, Power Measurement, specification, pp. 1-8, revision date Nov. 30, 2000.

"Power Quality—A guide to voltage fluctuation and light flicker"; BChydro Power Smart, Vancouver, B.C., Canada dated Mar. 2005; pp. 1-12.

3720 ACM, 3-phase Power Instruction Package, Power Measurement, specification, 8 pages, revision date Dec. 16, 1998.

3720 ACM, Installation & Operation Manual, Power Measurement, 67 pages, revision date Apr. 4, 2000.

3200 ION, Installation & Basic Setup Instructions, (c)Power Measurement Ltd., Revision Date Apr. 25, 2001, 50 pages.

8400 ION/8500 Ion Instruction Leaflet, Power Measurement, pp. 1-8, Oct. 1999.

8500 ION Technical Documentation, 8500 ION and 8500 ION-PQ Advanced Intelligent Billing Meters, specification, Power Measurement, revision date Apr. 15, 1999.

Braden, R (editor), "Requirements for Internet Hosts-Application and Support", RFC 1123, pp. 1-97, Oct. 1989.

Brochure, Sentinel TM Electronic "Multimeasurement Meter," Schlumberger, Mar. 2001, 4 pages.

Cerf et al., A Protocol for Packet Network Intercommunication, IEEE Trans on Comms, vol. Com-22, No. 5, May 1974, 13 pp. (Year: 1974).

Communicator EXT 3.0 User Manual Revision 1.32, Electro Industries/Gauge Tech, 558 pages, Aug. 27, 2007.

Deutsch, P., Emtage, A., and Marine, A., "How to Use Anonymous FTP", RFC1635, pp. 1-13, May 1994.

Electro Industries/Gauge Tech DM Series—specification brochure, "DMMS 425 Low-Cost Multifunction Power Monitoring Outperforms All Others in its Class", 4 pages.

Futura+Series, "Advanced Power Monitoring and Analysis for the 21st Century", Electro Industries/Gauge Tech, specification, 8 pages, Apr. 13, 2000.

http://www.landisgyr.us/Landis_Gyr/Meters/2510_socket_meter. asp, Apr. 18, 2005, 25 pages.

Hubbert, "What is flat file?", WhatIs.com, http://searchsqlserver.techtarget.com/definition/flat-file, Jul. 2006, 1 pp.

ION 7550/ION7650 User Guide Power Measurement—Revision Date Aug. 31, 2004.

ION Technology 7700 ION 3-Phase Power Meter, Analyzer and Controller, Power Measurement, specification, pp. 1-10, revision date Dec. 8, 1998.

ION Technology 7700 ION Installation & Operation Manual, Power Measurement, revision date Nov. 20, 1996.

Ion Technology 8500 ION. 8400 ION Advanced Socket-Mount Meter, specification, Power Measurement, pp. 1-12, revision date Dec. 3, 1999.

ION Technology, 7500 ION High Visibility 3-Phase Energy & Power Quality Meter, Power Measurement, specification, pp. 1-8, revision date Mar. 21, 2000.

ION(R) Technology, Meter Shop User's Guide, (C)Power Measurement Ltd., Revision DAte May 10, 2001, 48 pages.

ION7550/ion7650 PowerLogic power-monitoring units, Technical data sheets, pp. 1-12, Copyright 2006 Schneider Electric.

Manual, "3300 ACM, Economical Digital Power Meter/Transducer—Installation and Operation Manual, Power Measurement, Ltd. ", 1999, pp. 79.

Nagura et al., "Correction method for a single chip power meter", May 10-12, 1994, IEEE, 1994 IEEE Instrumentation and Measurement Technology Conference, 1994. ITMC/94.

Nexus 1250 Installation and Operation Manual Revision 1.20, Electro Industries/Gauge Tech, 50 pages, Nov. 8, 2000.

Nexus 1250, Precision Power Meter & Data Acquisition Node, Accumeasure Technology, Electro Industries/Gauge Lech, specification, 16 pages, Nov. 1999.

Nexus 1250/1252 Installation and Operation Manual Revision 1.31, Electro Industries/Gauge Tech, 146 pages, Jan. 21, 2010.

Nexus 1500 Installation and Operation Manual Revision 1.03, Electro Industries/Gauge Tech, 124 pages, Jan. 4, 2010.

Performance Power Meter & Data Acquisition Node, Electro Industries/Gauge Tech, Nexus 1250 specification, 8 pages, Dec. 14, 2000.

Postel, J.B., and Reynolds, J.K. "File Transfer Protocol (FTP)", RFC959, pp. 1-66, Oct. 1985.

Power Platform 4300 Multi-DAQ TASKCard Operator's Manual; Dranetz-BMI, Original Issue—Jul. 2002, pp. 203.

Power Platform PP1 & PP1E TASKCard-lnrush Operator's Manual; Dranetz-BMI, Revision A—Apr. 15, 1997, pp. 231.

PowerLogic Series 4000 Circuit Monitors, pp. 1-4; Document #3020HO0601; Jan. 2006.

(56) References Cited

OTHER PUBLICATIONS

Ramboz, J.D. And Petersons, O., Nist Measurement Services: A Calibration Service for Current Transformers, U.S. Dept. of Commerce, National Institute of Standards and Tech., U.S. Gov. PMtg. Ofc., Jun. 1991.
Series 5500 InfoNode User's Gide; Dranetz-BMI, Edison, NJ; Copywright 1999, 2002, 2004; pp. 1-220.
Speirs, "What is binary file?", WhatIs.com, http://whatis.techtarget.com/definition/binary-file, Apr. 2005, 1 pp.
The Dranetz Field Handbook for Power quality Analysis; Dranetz Technologies Incorporated, Edison, NJ; Copyright 1991; pp. 1-271.
User's Installation & Operation and User's Programming Manual. The Futura Series, Electro Industries, pp. 1-64, Copyright 1995.
Webopedia, https://web.archive.org/web/20021015112112/http://www.webopedia.com/TERM/F/flat_file_system.html, 2 pp., Oct. 15, 2002.
Zeinalipour-Yazti et ai, MicroHash: An Efficient Index Structure for Flash-Based Sensor Devices, Proceedings of the 4th Conference on USENIX Conference on File and Storage Technologies, vol. 4, Dec. 2005, pp. 14.

\* cited by examiner

POWER METER HAVING MULTIPLE ETHERNET PORTS

PRIORITY

The present application is a continuation application of U.S. application Ser. No. 13/463,192, filed on May 3, 2012, now U.S. Pat. No. 9,194,720, which is a continuation application of U.S. application Ser. No. 12/824,459, filed on Jun. 28, 2010, now U.S. Pat. No. 8,176,174, which is a continuation application of U.S. application Ser. No. 11/039,316, filed on Jan. 19, 2005, now U.S. Pat. No. 7,747,733, which claims priority from a U.S. provisional patent application filed on Oct. 25, 2004 and assigned U.S. Provisional Application Ser. No. 60/621,750, the contents of all are incorporated herein by reference.

BACKGROUND OF THE INVENTION

1. Field of the Invention

The present disclosure relates generally to an electrical device, and more specifically, to a power meter having multiple Ethernet ports.

2. Description of the Prior Art

Power meters are used in industrial and energy utility applications to provide telemetry on power usage and power quality, including: transmitting power, energy, voltage and current readings, using serial communications channels. Some currently available power meters also have the capability to record waveforms based on predefined recording thresholds and transmit the waveform data.

In recent years, the industry has shifted from serial to Ethernet communication architectures allowing for faster data throughput and the ability to access data via the Internet. Because of this shift, there is a desire in the industry to provide meter readings over the Internet while still allowing access of the meters over an internal LAN for telemetry, control and programming. Currently, to accomplish these tasks, operators have been required to set up routers to control access to the meters. Unfortunately, this method is vulnerable to intruders, or hackers, who can potentially access the internal LAN via the Internet. Therefore, this security concern discourages the industry from allowing access to power meters via the Internet. Accordingly, a need exists for a power meter having two Ethernet ports, each of which is independent and communicatively isolated from each other in a manner which enables control of metering functions by authorized personnel via a LAN while preventing intrusion and malicious modification of these functions from unauthorized users via the Internet.

SUMMARY OF THE INVENTION

The present disclosure provides an electrical device having multiple Ethernet ports, and more particularly, to a power meter having two independent and communicatively isolated Ethernet ports and monitoring components for measuring an electrical parameter, such as current flow. The first Ethernet port is addressable by a first unique identifier and is configured for enabling full access to the power meter via an internal LAN. This enables a LAN operator to remotely access the power meter via the internal LAN for performing metering functions, such as full telemetry, control and programming.

The second Ethernet port is addressable by a second unique identifier and is configured for being connected to the Internet. Since the second Ethernet port is communicatively isolated from the first Ethernet port, a user, including the LAN operator, can access the power meter via the Internet, but cannot access the internal LAN by connecting to the power meter via the Internet.

The first and second unique identifiers are preferably MAC addresses. However, one skilled in the art can appreciate that other identifiers may be used to identify and address the first and second Ethernet ports.

The present disclosure further provides a method for communicating with a plurality of electrical devices or power meters 100. The method includes the step of providing a plurality of electrical devices or power meters 100 each having a first Ethernet port 214 and a second Ethernet port 222. Each Ethernet port has a unique identifier as and is communicatively isolated from the other Ethernet port. The method also includes the steps of accessing power meter 100 via first Ethernet port 214 via a first network, such as the internal LAN 810; and accessing power meter 100 via second Ethernet port 222 via a second network, such as the Internet or World Wide Web 812. Since the two Ethernet ports are communicatively isolated from each other, an Internet user cannot access internal LAN 810 by connecting to power meter 100 via the second Ethernet port-Internet connection. Conversely, the LAN operator cannot access Internet 812 by connecting to power meter 100 via the first Ethernet port-LAN connection.

The method further includes the step of remotely controlling the operation of one of the plurality of power meters 100 by transmitting control operations and parameters to the power meter 100 via a corresponding first Ethernet port-LAN connection. The method further includes the step of remotely accessing a storage module 818 of one of the plurality of power meters 100 via a corresponding second Ethernet port-Internet connection for viewing meter readings stored by storage module 818.

BRIEF DESCRIPTION OF THE DRAWINGS

These and other features, aspects, and advantages of the present disclosure will become better understood with regard to the following description, appended claims, and accompanying drawings wherein:

DESCRIPTION OF THE PREFERRED EMBODIMENTS

Three-phase power is most commonly used in situations where large amounts of power will be used because it is a more effective way to transmit the power and because it provides a smoother delivery of power to the end load. There are two commonly used connections for three-phase power, a wye connection or a delta connection.

As used herein and as is typical in the art, a "wye connection" is understood to have a phase relation and a winding relationship between the phases, which substantially approximates the look of a wye ("Y"). In a wye connection or service, the neutral (or center point of the wye) is typically grounded. This leads to common voltages of 208/120 and 480/277 (where the first number represents the phase-to-phase voltage and the second number represents the phase-to-ground voltage). The three voltages are separated by 120 degrees electrically. Under balanced load conditions with unity power factor, the currents are also separated by 120 degrees.

As used herein and as is typical in the art, a "delta connection" is understood to have load windings, which are connected from phase-to-phase rather than from phase-to-ground.

Embodiments of the present disclosure will be described in detail herein below with reference to the accompanying drawings. In the following description, numerous specific details are set forth to provide a more thorough understanding of the present disclosure. It will be apparent, however, to one skilled in the art that the present disclosure may be practiced without these specific details. In other instances, well known functions or constructions have not been described so as not to obscure the present disclosure.

Figure 1:
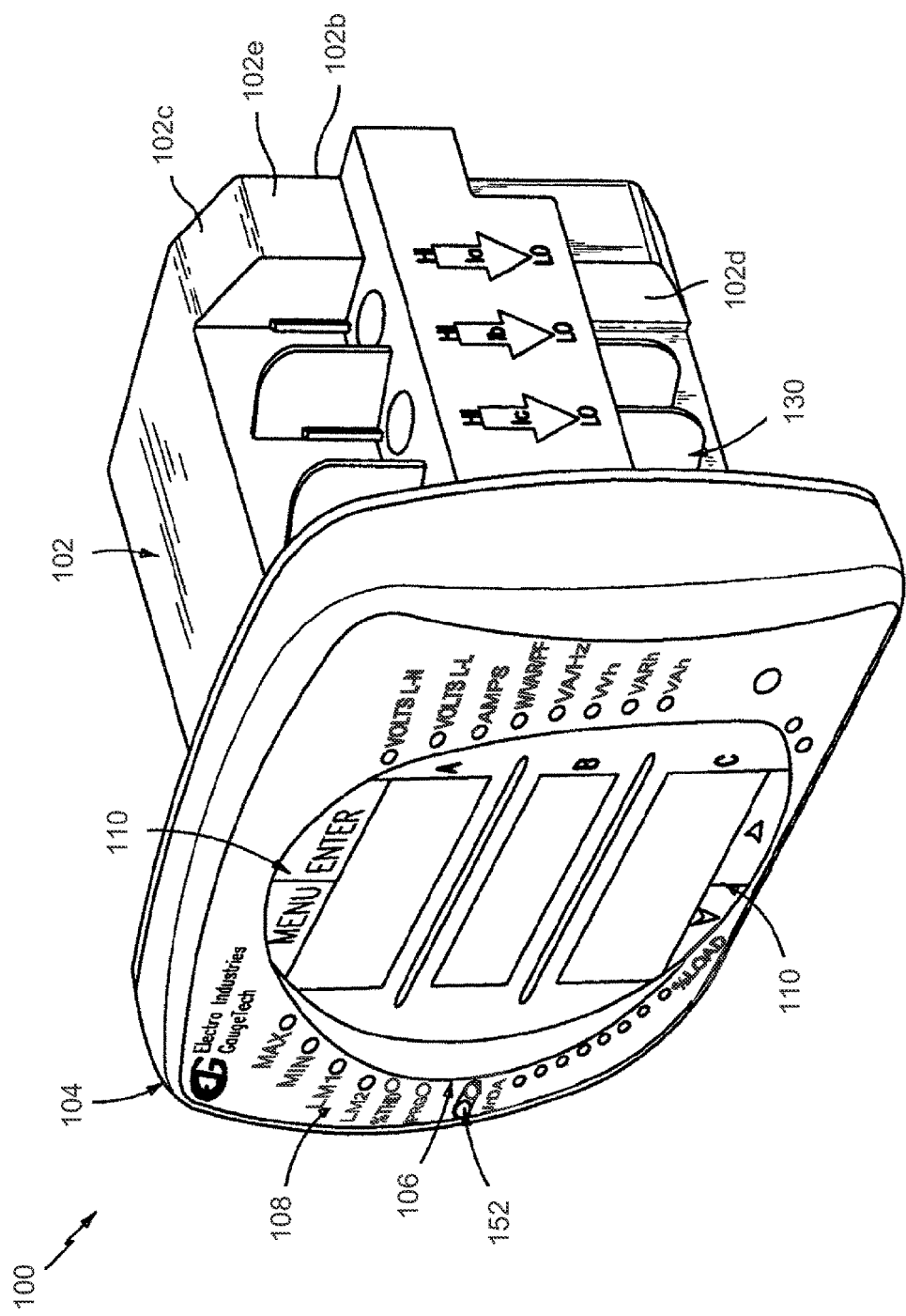
FIG. 1 is a perspective view of an electrical device having multiple Ethernet ports in accordance with the present disclosure.
Figure 2:
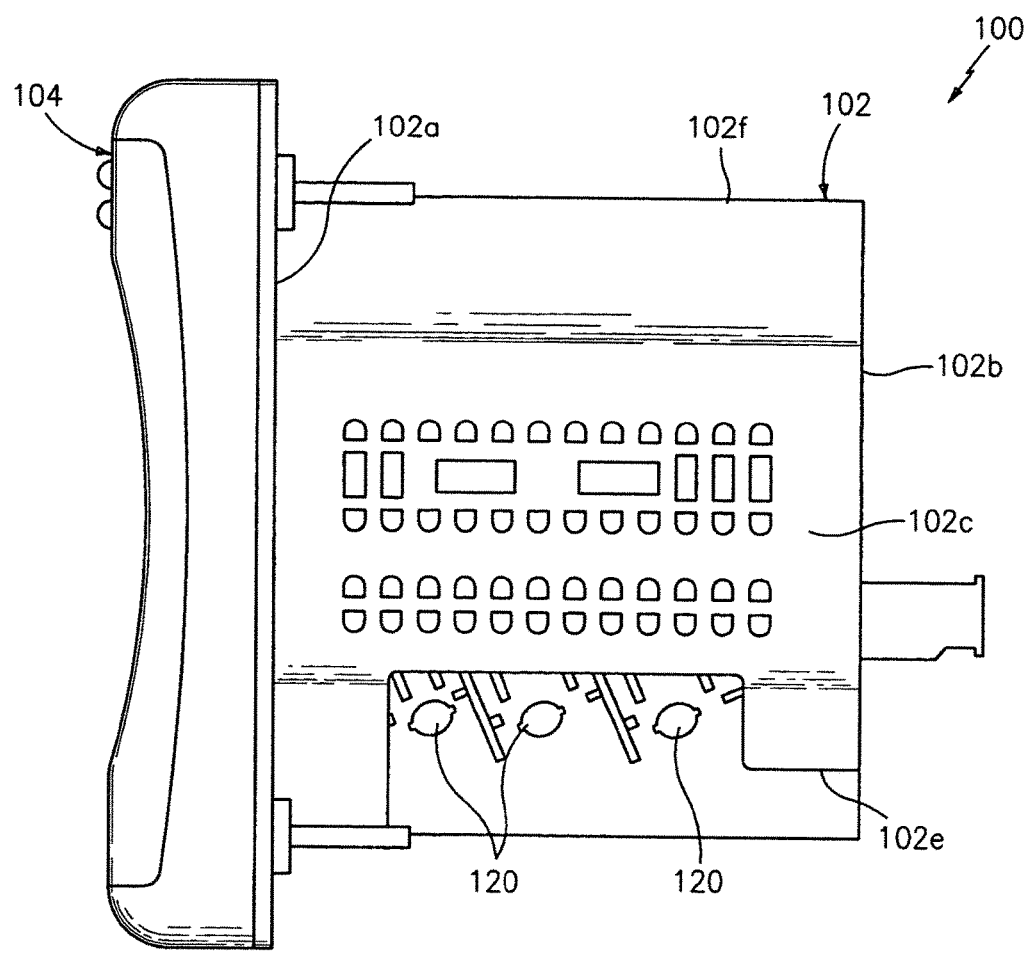
FIG. 2 is a top plan view of the electrical device of FIG. 1.
Figure 3:
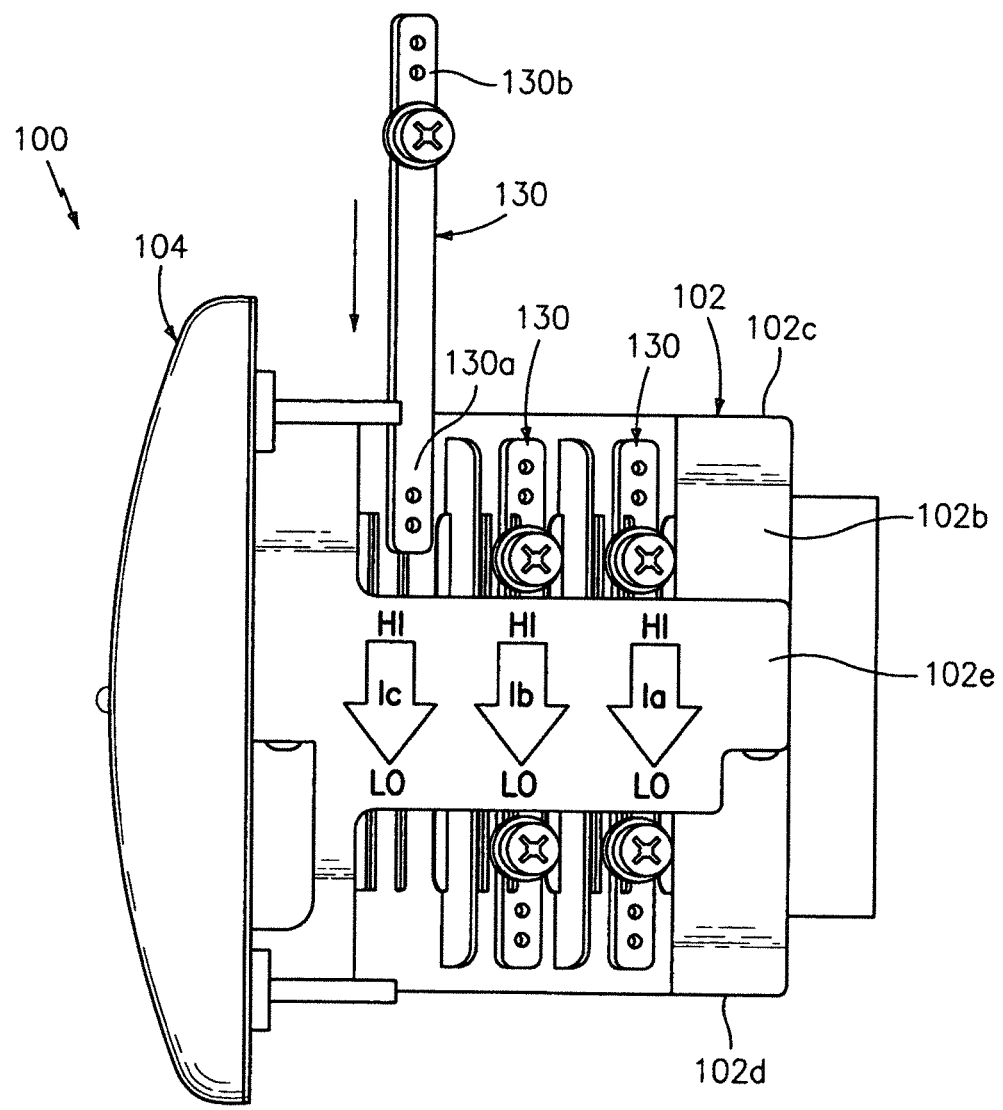
FIG. 3 is a side elevational view of the electrical device of FIGS. 1 and 2.

Referring initially to FIGS. 1-3, an electrical device, e.g., an electronic power meter, in accordance with an embodiment of the present disclosure, is generally designated as 100. As seen in FIGS. 1-3, electrical device 100 includes a housing 102 defining a front surface 102a, a rear surface 102b, a top surface 102c, a bottom surface 102d, a right side surface 102e, and a left side surface 102f. Electrical device 100 includes a faceplate 104 operatively connected to front surface 102a of housing 102.

Faceplate 104 includes displays 106, indicators 108 (e.g., LEDs and the like), buttons 110, and the like providing a user with an interface for visualization and operation of electrical device 100. For example, as seen in FIG. 1, faceplate 104 of electrical device 100 includes analog and/or digital displays 106 capable of producing alphanumeric characters. Faceplate 104 includes a plurality of indicators 108 which, when illuminated, indicate to the user the "type of reading", the "% of load bar", the "parameter designation" which indicates the reading which is being displayed on displays 106, a "scale selector" (e.g., Kilo or Mega multiplier of Displayed Readings), etc. Faceplate 104 includes a plurality of buttons 110 (e.g., a "menu" button, an "enter" button, a "down" button, a "right" button, etc.) for performing a plurality of functions, including and not limited to: viewing of meter information; enter display modes; configuring parameters; performing re-sets; performing LED checks; changing settings; viewing parameter values; scrolling parameter values; and viewing limit states.

As seen in FIGS. 4-7, electrical device 100 includes a first Ethernet port 214 and a second Ethernet port 222. The two Ethernet ports 214, 222 as further described below are independent and communicatively isolated from each other. The first Ethernet port 214 is configured for being connected to an internal LAN 810 while the second Ethernet port 222 is configured for being connected to the Internet or World Wide Web 812.

Figure 5:
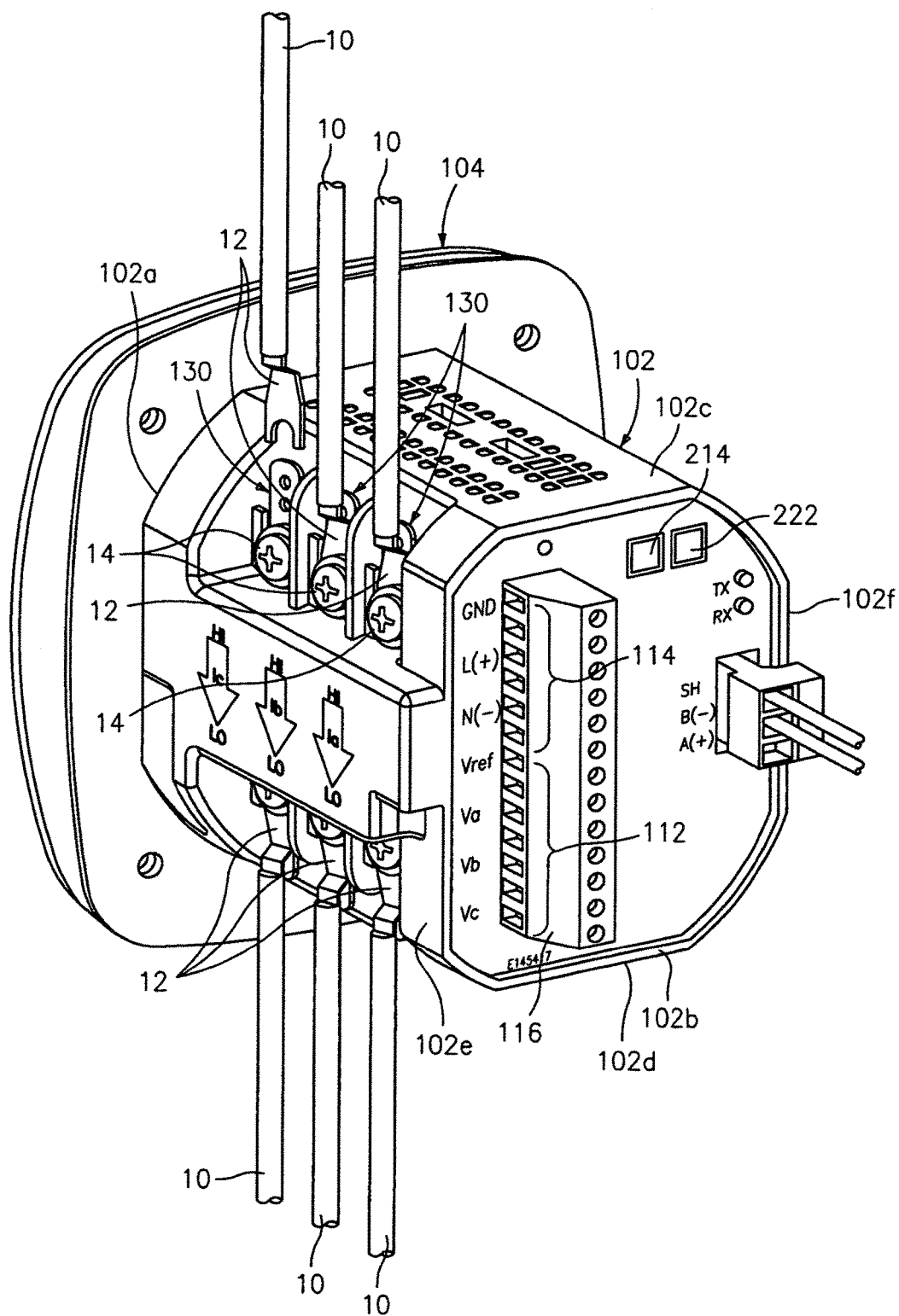
FIG. 5 is a rear perspective view of the electrical device of FIGS. 1-3 illustrating the connection of lead terminals thereto, in accordance with another method of the present disclosure.
Figure 6:
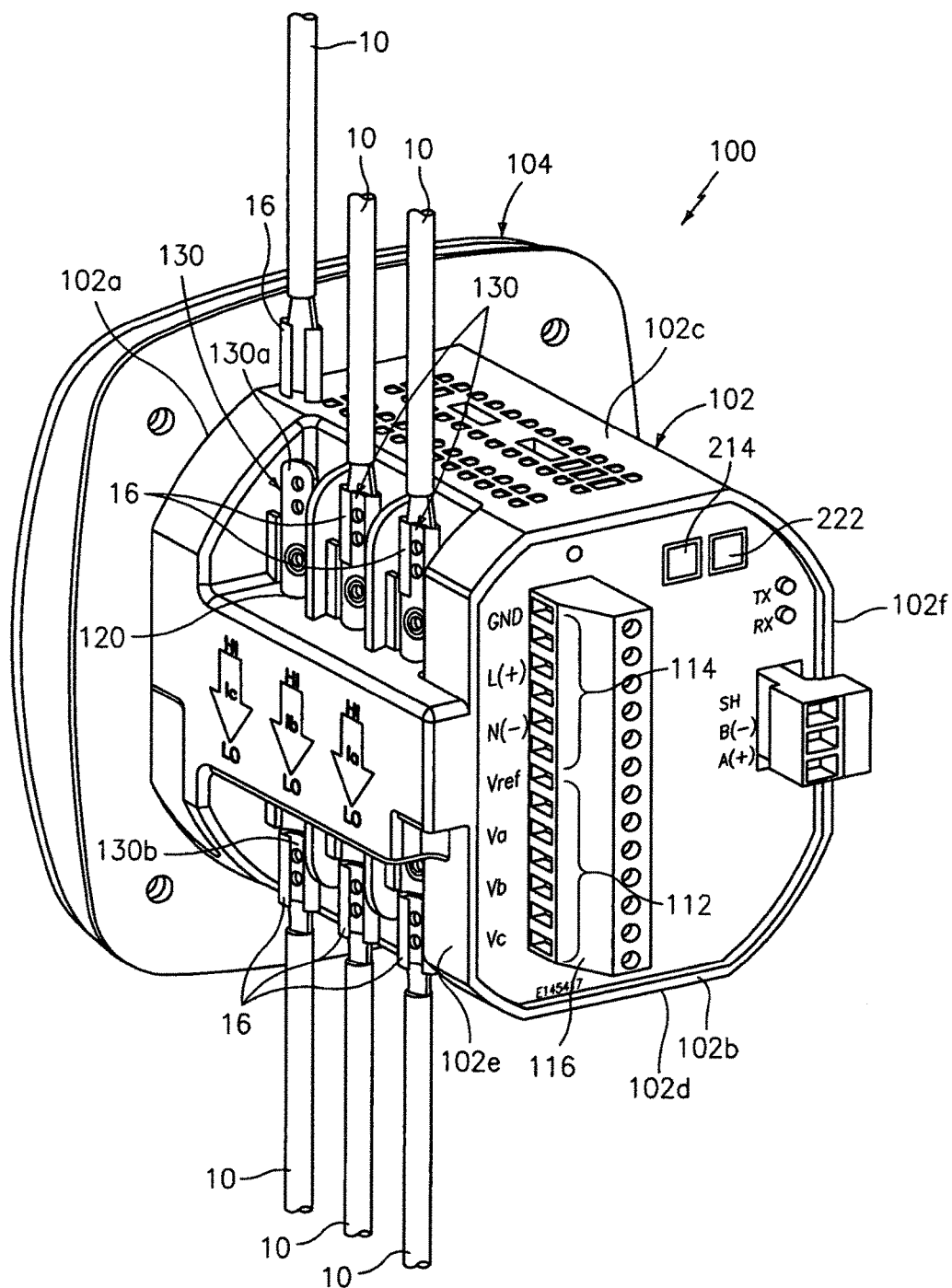
FIG. 6 is a rear perspective view of the electrical device of FIGS. 1-3 illustrating the connection of lead terminals thereto, in accordance with yet another method of the present disclosure.
Figure 7:
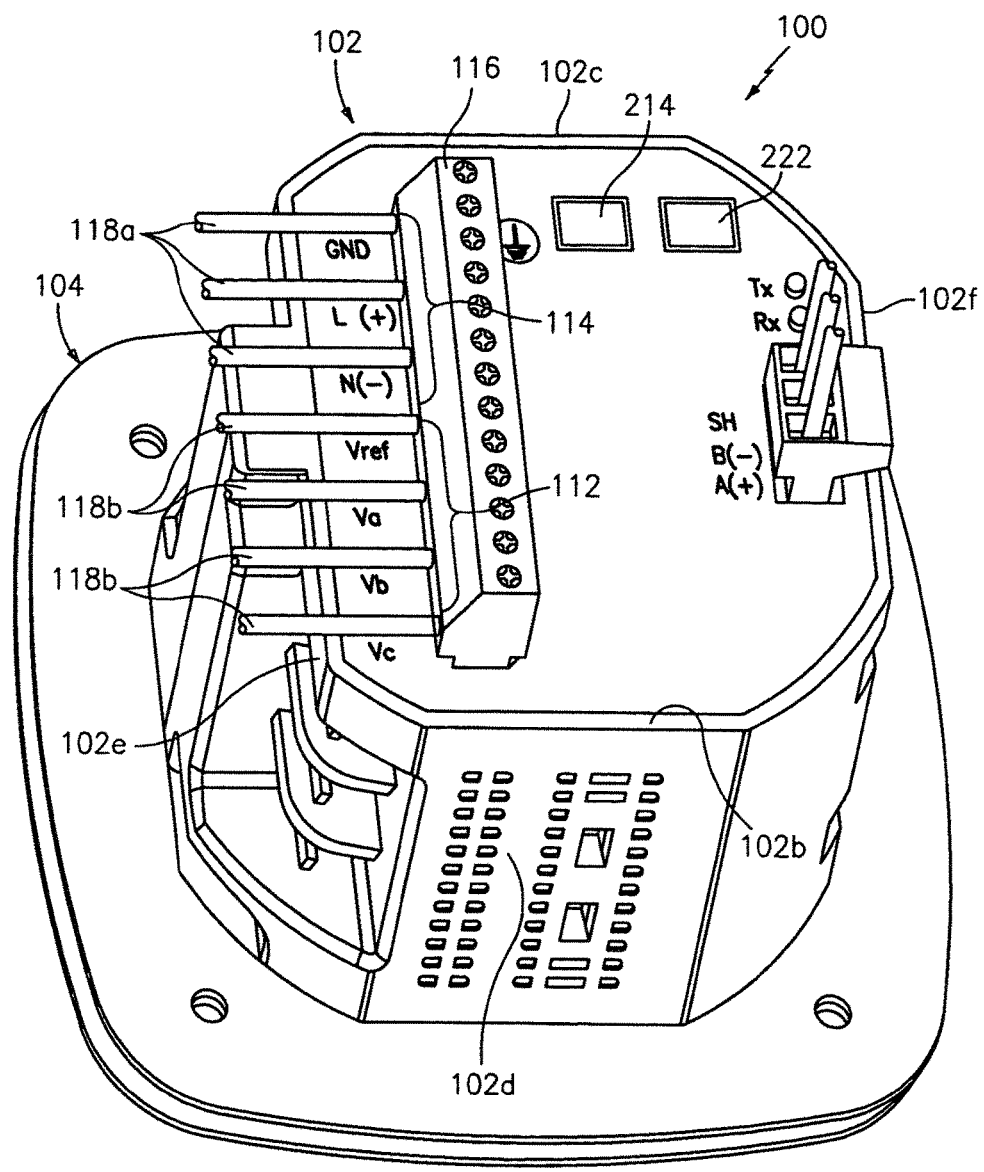
FIG. 7 is a rear perspective view of the electrical device of FIGS. 1-3 illustrating the connection of power supply and voltage inputs thereto, in accordance with a method of the present disclosure.

As further seen in FIGS. 4-7, housing 102 includes voltage connections or inputs 112 provided preferably on rear surface 102b thereof, and current inputs 114 provided preferably along right side surface 102e thereof. Desirably, a connector 116 or the like may be used to connect power supply lines 118a and/or voltage supply lines 118b to voltage inputs 112. In particular, as seen in FIG. 7, power supply lines 118a and voltage supply lines 118b are electrically connected to connector 116 which is, in turn, electrically connected to voltage inputs 112. Power supply lines 118a and voltage supply lines 118b are electrically connected to internal components, circuitry and/or printed circuit boards (not shown) of electrical device 100.

As seen in FIG. 2, housing 102 includes a series of pass-throughs or apertures 120 formed along right side surface 102e thereof and extending desirably between top surface 102c and bottom surface 102d thereof. While apertures 120 are shown and described as being formed along right side surface 102e of housing 102 it is envisioned and within the scope of the present disclosure for apertures 120 to be formed along any side of housing 102. As will be described in greater detail below, apertures 120 enable connection of electrical device 100 according to a first method, e.g., a "CT (Current Transformer) Pass Through" method.

As seen in FIG. 3, electrical device 100 may include a plurality of "gills" 130 configured and dimensioned to extend through each aperture 120 of housing 102. Gills 130 are desirably elongate electrically conductive plates or bars having a first end 130a and a second end 130b. As will be described in greater detail below, gills 130 allow for CT leads to be terminated on electrical device 100. Desirably, gills 130 are fabricated from nickel-plated brass.

Figure 4:
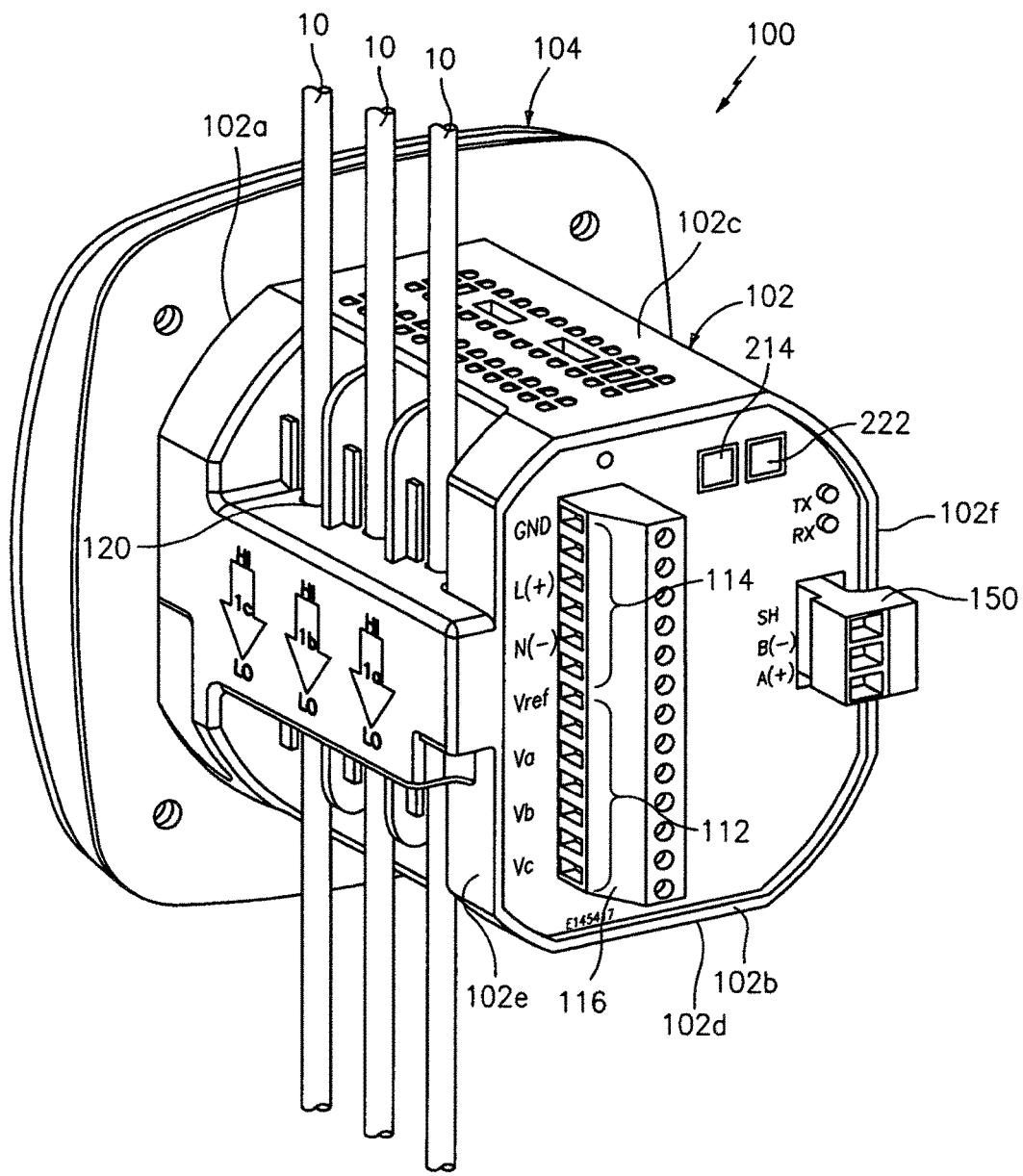
FIG. 4 is a rear perspective view of the electrical device of FIGS. 1-3 illustrating the connection of lead terminals thereto, in accordance with a method of the present disclosure.

Turning now to FIG. 4, a method of connecting electrical device 100 according to the "CT Pass Through" method is shown and described. Connection of electrical device 100 according to the "CT Pass Through" method typically requires passage of CT lead(s) 10 through apertures 120 of housing 102. Accordingly, CT lead(s) 10 pass directly though electrical device 100 without any physical termination on electrical device 100. Extending CT leads 10 to electrical device 100 according to the "CT Pass Through" method insures that electrical device 100 cannot be a point of failure on the circuit.

Turning now to FIG. 5, an alternate method of connecting electrical device 100 is shown and described. As seen in FIG. 5, gills 130 have been inserted into apertures 120 formed in housing 102. Desirably, first ends 130a of gills 130 are exposed along top surface 102c of housing 102 and second ends 130b of gills 130 are exposed along bottom surface 102d of housing 102. In this manner, CT leads 10 may be electrically connected to first ends 130a of gills 130 and/or second ends 130b of gills 130. Desirably, CT leads 10 are provided with an "O" or "U" lug 12 at a free end thereof for terminating CT leads 10 to gills 130. For example, a screw 14 or the like may be used to connect lug 12 of CT lead 10 to gill 130. As seen in FIG. 5, by terminating CT leads 10 to gills 130 of electrical device 100, the possibility of a point of failure occurring at electrical device 100 is eliminated.

As seen in FIG. 6, according to an alternate method, lugs 12 may be replaced by friction fit quick connectors 16. Accordingly, in use, CT leads 10 may be terminated and/or electrically connected to gills 130 by sliding quick connectors 16 over the tips of first and second ends 130a, 130b of gills 130.

In each of the embodiments above, CT leads 10 either extend through housing 102 of electrical device or terminate on gills 130 which are un-connected to any electrical component of electrical device 100. Unlike the embodiments disclosed herein, other electrical device (e.g., electrical meters) utilize terminal blocks to pass the current, traveling through the CT leads, through a soldered connection on a printed circuit board. Accordingly, the prior art electrical devices may be susceptible to burn-out or failure in the event of a surge in current through the CT leads.

Turning back to FIG. 4, electrical device 100 may include a first interface or communication port 150 for connection to a master and/or slave device. Desirably, first communication port 150 is situated in rear surface 102b of housing 102. Electrical device 100 may also include a second interface or communication port 152 situated on faceplate 104 (see FIG. 1).

Figure 8:
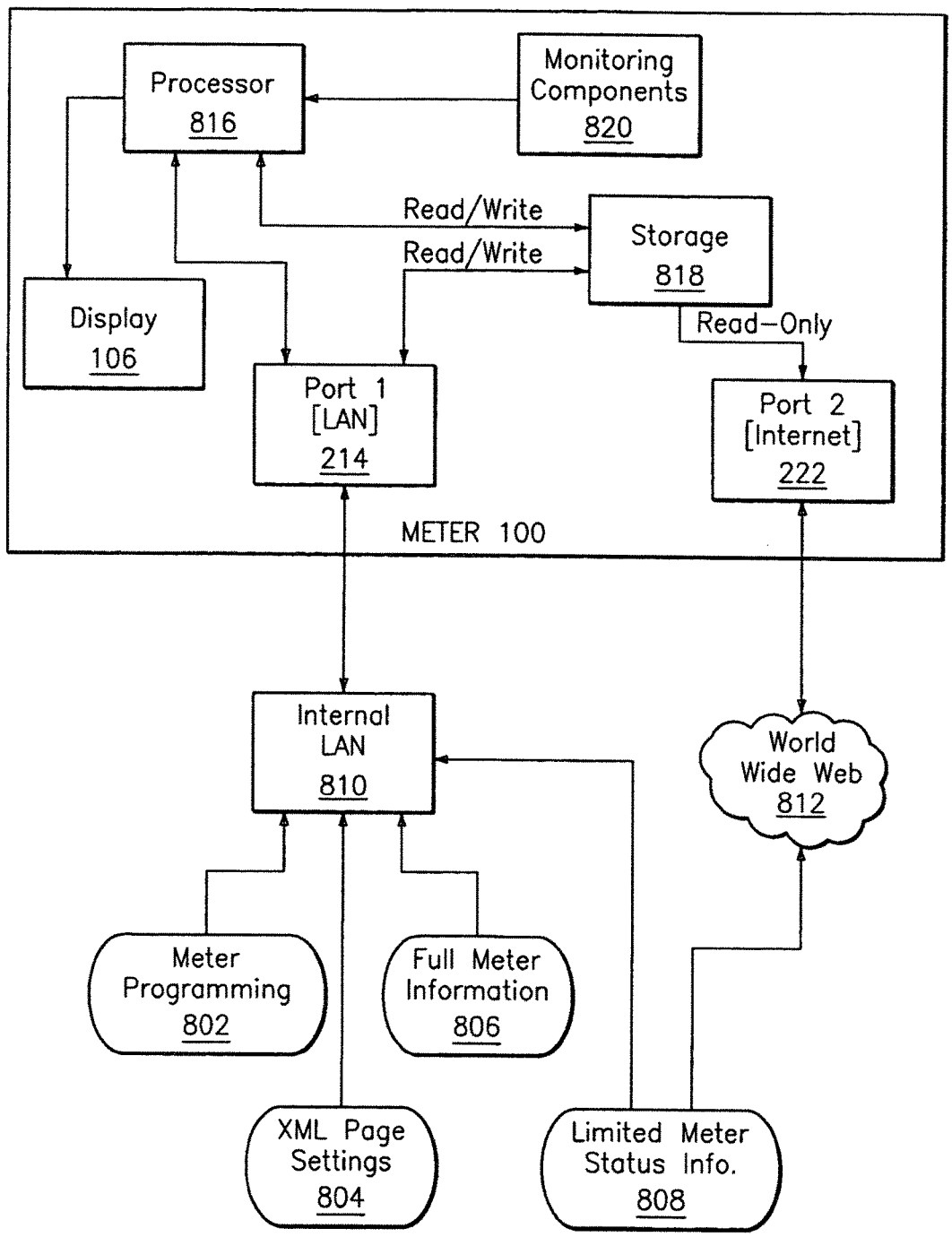
FIG. 8 is a flowchart showing allowable access paths for accessing the electrical device having multiple Ethernet ports in accordance with the present disclosure.

Referring to FIG. 8, electrical device 100 provides access to status information and other data stored within a storage module 818, such as a flash memory module, via second Ethernet port 222. Second Ethernet port 222 is configured for being connected to Internet or World Wide Web 812 as stated above for enabling access to the status information and other data. Second Ethernet port 222 can be connected to the Internet or World Wide Web 812 by one or more network communication protocols known in the art, such as TCP/IP.

Second Ethernet port 222 does not have access to a processor 816 and monitoring components 820 of electrical device 100. Hence, access to electrical device 100 via the Internet does not enable a user to delete and/or reprogram functions programmed within processor 816 of electrical device 100 or program electrical device 100. Additionally, the user cannot communicate or access LAN 810 via the second Ethernet port-Internet connection. Accordingly, the architecture of electrical device 100 prevents unauthorized access to processor 816 and LAN 810 (or other device connected to first Ethernet port 214), while allowing access to stored data within electrical device 100 via Internet 812. Port 1 enables the user to configure what is to be placed on the port 2 address so that no "hacker or unwanted viewer of the data can use the meter to "hack" into a general network and/or operate or control the equipment. This creates a dedicated impenetrable firewall within the meter allowing only the data the user desires to be placed on the web sever to go through, as will be described below.

In an alternate embodiment, second Ethernet port 222 does have access to the processor 816 and monitoring components 820 of electrical device 100. However, Ethernet port 214 dictates or controls what data stored within processor 816 can be accessed via Ethernet port 222. In this embodiment, one cannot program processor 816 by accessing it via Ethernet port 222.

Preferably, processor 816 of electrical device 100 is programmed by the transmission of programming signals from internal LAN 810 via the first Ethernet port-LAN connection for enabling the creation of web browser viewable documents, which are stored in storage module 818. The documents may be created in XML, HTML, or other webpage formats. Second Ethernet port 222 provides read-only access to storage module 818, thus allowing an Internet user to view the web browser viewable documents via the second Ethernet port-Internet connection while preventing the Internet user from modifying these documents and other data stored by storage module 818. Further, the Internet user is prevented from causing the storage of data within storage module 818 via the second Ethernet port-Internet connection.

With continued reference to FIG. 8, electrical device 100 enables an array of functions, e.g., meter programming 802, webpage setup 804, preferably, XML webpage setup, complete or full meter status information 806 and limited meter status information 808, to be performed by an operator/user via internal LAN 810 or Internet 812. While the full array of functions 802, 804 can be performed and status information 806, 808 (including other type of information) can be accessed via the first Ethernet port-internal LAN connection, only limited meter status information 808 can be accessed via the second Ethernet port-Internet connection.

Ethernet port 214 is configured for connection to internal LAN 810, for providing access to processor 816 and for providing read/write access to storage module 818. Processor 816 is remotely accessible and programmable via the first Ethernet port-LAN connection for controlling various functions of electrical device 100. Processor 816 parses and implements the programmable instructions received via the first Ethernet port-LAN connection and which are embedded within programming signals for controlling the various functions of electrical device 100. These functions include setting the operational parameters of monitoring components 820; receiving data, such as meter readings, from monitoring components 820 and processing said data; executing diagnostic tests on monitoring components 820; controlling monitoring to components 820 for measuring one or more electrical parameters, such as current flow; creating and/or maintaining webpages for storage in storage module 818; and other functions. The webpages display one or more meter readings and parameters to the Internet user via the user's computer terminal connected to electrical device 100 via the second Ethernet port-Internet connection.

Webpages are created by the LAN operator providing page settings 804, such as XML page settings, to electrical device 100 via the first Ethernet port-LAN connection. The page settings 804 generally include selecting information to be displayed via the webpages, refresh rate of the information displayed, and selecting basic webpage layout. Processor 816 using page settings 804 creates webpages displaying the information received from monitoring components 820 and stores the created webpages in storage module 818. Processor 816 continuously refreshes the webpages according to the refresh rate specified by the operator, whereupon updated meter readings and other information replaces or overwrites the outdated information displayed by the webpages.

It is contemplated that the updated meter readings are appended to a table containing previous meter readings and displayed by a webpage, such that the previous meter readings are not replaced or overwritten. The meter readings and other data viewable via the webpages are generally or substantially identical to the meter readings and data displayed on displays 106 of electrical device 100, since processor 816 is in operative communication with the displays 106.

Access to the storage medium 818 via the second Ethernet port-Internet connection transmits one or more webpages to the Internet user's computer terminal for viewing thereof. It is contemplated that the Internet user provides a password which is authenticated by the electrical device 100 before the one or more webpages are transmitted to the user's computer terminal.

Ethernet port 214 is addressable via a first unique identifier and Ethernet port 222 is addressable via a second unique identifier. First and second unique identifiers are preferably MAC addresses. However, one skilled in the art can appreciate that other identifiers may be used to identify and address the first and second Ethernet ports.

The present disclosure further provides a method for communicating with a plurality of electrical devices or power meters 100. The method includes the step of providing a plurality of electrical devices or power meters 100 each having a first Ethernet port 214 and a second Ethernet port 222. Each Ethernet port has a unique identifier as and is communicatively isolated from the other Ethernet port, such that electrical signals are prevented from being transmitted from the second Ethernet port-Internet connection to the first Ethernet port-LAN connection.

The method also includes the steps of programming power meter 100 via first Ethernet port 214 via a first network, such as the internal LAN 810; and accessing data stored within power meter 100 via first Ethernet port 214 via the first network and/or second Ethernet port 222 via a second network, such as the Internet or World Wide Web 812. Since the two Ethernet ports are communicatively isolated from each other, an Internet user cannot access internal LAN 810 by connecting to power meter 100 via the second Ethernet port-Internet connection. Conversely, the LAN operator cannot access Internet 812 by connecting to power meter 100 via the first Ethernet port-LAN connection.

The method further includes the step of remotely controlling the operation of one of the plurality of power meters 100 by transmitting control operations and parameters to the power meter 100 via a corresponding first Ethernet port-LAN connection. The control operations and parameters can specify what to measure (current flow, power, voltage output, etc.), what data to display via displays 106, how often status data is to be updated, etc. The method further includes the step of remotely accessing a storage module 818 of one of the plurality of power meters 100 via a corresponding second Ethernet port-Internet connection for viewing meter readings stored by storage module 818.

Figure 9:
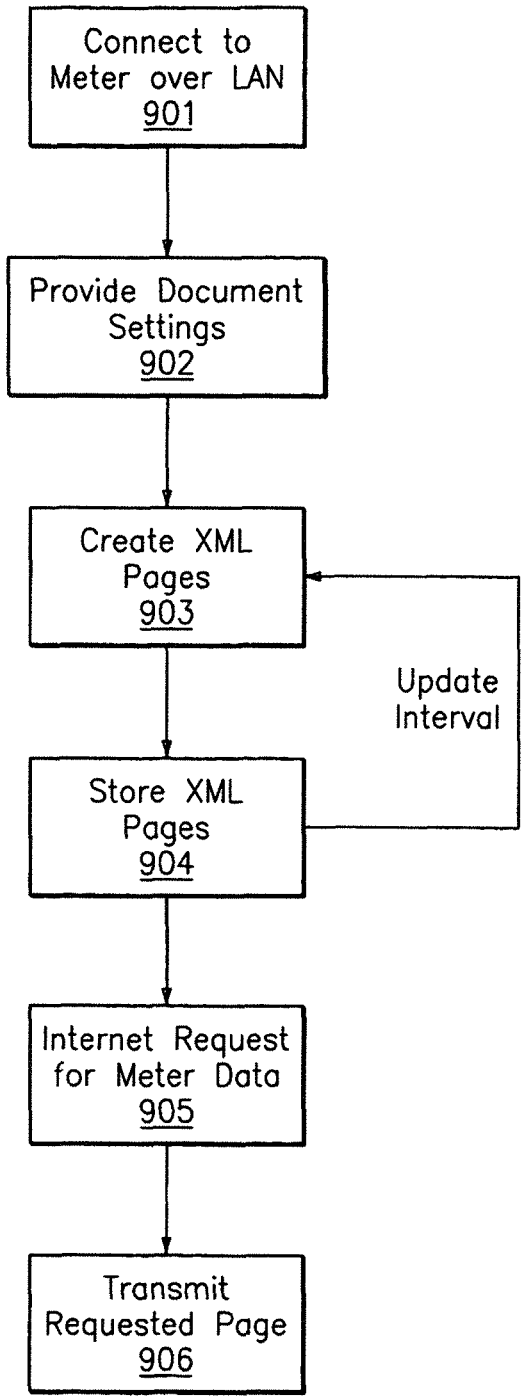
FIG. 9 is a flowchart illustrating a method for accessing the electrical device via a LAN and the Internet in accordance with the present disclosure.

As shown in FIG. 9, the present disclosure further provides a method for retrieving power meter data across both LAN 810 and Internet 812 while maintaining security from unauthorized intrusion and hacking of LAN 810 via Internet 812. The method is initiated with step 901, wherein the LAN operator connects to electrical device or meter 100 through LAN 810 via the first Ethernet port-LAN connection. This connection provides the LAN operator with full access to all the features of meter 100, i.e., programmable, control and data access features of meter 100.

In step 902, the LAN operator provides document settings specifying which meter readings will be reported and how often the meter readings will be updated on the webpages created by processor 816 in step 903. Processor 816 acquires meter readings, or status data, from one or more monitoring components 820, such as a probe, and in accordance with the document settings provided in step 902, processor 816 parses the status data and creates webpages for displaying the data. In step 904, the webpages are stored in the storage module 818, such as an optical media, hard drive, RAM, flash memory module, etc. At the update interval specified in the document settings provided in step 902, steps 903 and 904 are repeated, thereby updating the meter readings which are displayable via the webpages.

Accessing the limited meter readings via the second Ethernet port-Internet connection occurs in step 905, wherein the Internet user transmits a request for viewing a webpage stored within storage module 818 of power meter 100. The webpage can include a homepage, i.e., introductory or index, page, which provides hyperlinks to various other webpages stored in storage module 818. Proceeding to step 906, the requested webpage is retrieved from storage module 818 and transmitted to the Internet user via the second Ethernet port-Internet connection.

The described embodiments of the present disclosure are intended to be illustrative rather than restrictive, and are not intended to represent every embodiment of the present disclosure. Various modifications and variations can be made without departing from the spirit or scope of the disclosure as set forth in the following claims both literally and in equivalents recognized in law.

What is claimed is:

1. A method for communicating with at least one electrical metering device comprising the steps of:
    providing the at least one electrical metering device including at least one monitoring component that measures one or more electrical parameters of an electrical distribution system delivering power to at least one load, the at least one monitoring component coupled to at least one of voltage inputs and/or current inputs coupled to the electrical distribution system;
    providing page settings, to at least one processor of the at least one electrical metering device, that specifies which of the one or more electrical parameters are to be displayed via at least one webpage;
    acquiring, by the at least one processor, the specified one or more electrical parameters from the at least one monitoring component;
    creating, by the at least one processor, at least one webpage for displaying the acquired one or more electrical parameters based on the page settings;
    storing, by the at least one processor, the created at least one webpage in a storage module of the at least one electrical metering device; and
    in response to receiving a request for viewing the created at least one webpage, transmitting the created at least one webpage from the storage module to a device over a network and preventing access to the at least one processor,
    wherein the at least one webpage includes hyperlinks to at least one other webpage of the acquired one or more electrical parameters store in the storage module.

2. The method of claim 1, wherein the page settings include a refresh rate of the one or more electrical parameters to be displayed.

3. The method of claim 2, further comprising updating the one or more electrical parameters associated to the created at least one webpage based on the refresh rate.

4. The method of claim 1, wherein the page settings include at least one webpage layout.

5. The method of claim 4, wherein the at least one webpage layout includes a homepage.

6. The method of claim 5, wherein the homepage includes hyperlinks to at least one other page stored in the storage module.

7. The method of claim 1, further comprising authenticating the request before the transmitting of the created at least one page.

8. The method of claim 7, wherein the authenticating requires a user password.

9. The method of claim 1, wherein the storage module includes at least one of an optical media, a hard drive, a random access memory (RAM) and/or a flash memory.

10. The method of claim 1, wherein the at least one metering device includes at least one display, data displayed by the at least one display is substantially identical to data transmitted within the created at least one page.

11. The method of claim 1, wherein the preventing access to the at least one processor is performed by a firewall.

12. The method of claim 1, wherein the at least one webpage is created using HTML and/or XML programming languages.

13. A non-transitory computer readable medium storing a program code that, when executed by the at least one electrical metering device, facilitates execution of the method of claim 1.

14. The non-transitory computer readable medium of claim 13, wherein the program code includes executable instructions for creating a fire wall.

15. The method of claim 1, wherein the network is the Internet.

16. An electrical metering device comprising:
at least one monitoring component configured for monitoring at least one parameter of an electrical distribution system delivering power to at least one load, the at least one monitoring component coupled to at least one of voltage inputs and/or current inputs coupled to the electrical distribution system;
at least one processor configured for receiving data from the at least one monitoring component; and
a storage module coupled the at least one processor, the storage module stores at least the received data from the at least one monitoring component;
wherein the at least one processor is configured to receive instructions, create at least one webpage from the data received from the at least one monitoring component based on the received instructions and store the created at least one webpage in the storage module, and
the storage module configured to provide read-only access to the stored at least one webpage in response to a request from a device over a network and prevent access to the at least one processor,
wherein the at least one webpage includes hyperlinks to at least one other webpage of the data received from the at least one monitoring component stored in the storage. module.

17. The electrical metering device of claim 16, wherein the instructions include page settings, the page settings including a refresh rate of the data to be displayed in the created at least one webpage.

18. The electrical metering device of claim 17, wherein the at least one processor updates the data associated to the created at least one webpage based on the refresh rate.

19. The electrical metering device of claim 17, wherein the page settings include at least one webpage layout.

20. The electrical metering device of claim 19, wherein the at least one webpage layout includes a homepage.

21. The electrical metering device of claim 20, wherein the homepage includes hyperlinks to at least one other webpage stored in the storage module.

22. The electrical metering device of claim 16, wherein the at least one processor authenticates the request before the transmitting of the created at least one webpage.

23. The electrical metering device of claim 22, wherein the authenticating requires a user password.

24. The electrical metering device of claim 16, wherein the storage module includes at least one of an optical media, a hard drive, a random access memory (RAM) and/or a flash memory.

25. The electrical metering device of claim 16, further comprising at least one display, data displayed by the at least one display is substantially identical to data transmitted within the at least one webpage.

26. The electrical metering device of claim 16, further comprising a housing, the housing including at least one display disposed on a front surface thereof, the at least one display in operative communication with the at least one processor.

27. The electrical metering device of claim 26, further comprising a communication port disposed on the front surface of the housing.

28. The electrical metering device of claim 27, further comprising a second communication port disposed on a surface of the housing, the second communication port communicates to a master and/or slave device.

29. The electrical metering device of claim 26, wherein the at least one display is configured to display a percentage of load bar as sensed by the at least one monitoring component.

30. The electrical metering device of claim 16, further comprising a firewall for preventing access to the at least one processor.

31. The electrical metering device of claim 16, wherein the at least one webpage is created using HTML and/or XML programming languages.

32. The electrical metering device of claim 16, wherein the network is the Internet.

* * * * *